US012457784B2

(12) United States Patent
John et al.

(10) Patent No.: US 12,457,784 B2
(45) Date of Patent: Oct. 28, 2025

(54) SEMICONDUCTOR DEVICE WITH LATERAL BASE LINK REGION

(71) Applicant: NXP B.V., San Jose, CA (US)

(72) Inventors: Jay Paul John, Chandler, AZ (US); James Albert Kirchgessner, Tempe, AZ (US)

(73) Assignee: NXP B.V., Eindhoven (NL)

(*) Notice: Subject to any disclaimer, the term of this patent is extended or adjusted under 35 U.S.C. 154(b) by 433 days.

(21) Appl. No.: 18/066,110

(22) Filed: Dec. 14, 2022

(65) Prior Publication Data

US 2024/0204052 A1 Jun. 20, 2024

(51) Int. Cl.
| | |
|---|---|
| *H10D 62/17* | (2025.01) |
| *H10D 10/01* | (2025.01) |
| *H10D 10/80* | (2025.01) |
| *H10D 62/13* | (2025.01) |
| H10D 62/10 | (2025.01) |

(52) U.S. Cl.
CPC ......... *H10D 62/177* (2025.01); *H10D 10/021* (2025.01); *H10D 10/861* (2025.01); *H10D 62/136* (2025.01); H10D 62/115 (2025.01)

(58) Field of Classification Search
CPC .. H10D 62/177; H10D 10/021; H10D 10/861; H10D 62/136; H10D 62/115; H10D 10/891; H10D 62/137
See application file for complete search history.

(56) References Cited

U.S. PATENT DOCUMENTS

| | | | |
|---|---|---|---|
| 8,933,537 B2 | 1/2015 | Fox et al. | |
| 10,224,423 B1 | 3/2019 | Gauthier et al. | |
| 10,374,069 B2 | 8/2019 | Chevalier | |
| 10,825,922 B2 | 11/2020 | John et al. | |
| 11,018,247 B1 | 5/2021 | Radic et al. | |
| 2007/0290231 A1* | 12/2007 | John .................... | H10D 10/821 257/E29.189 |
| 2011/0198591 A1* | 8/2011 | Meunier-Beillard ....................... | H10D 10/021 438/318 |

(Continued)

OTHER PUBLICATIONS

Rucker, H. et al; "SiGe HBT Technology"; Research Gate; Silicon-Germanium Heterojunction Bipolar Transistors for Mm-wave Systems Technology, Modeling and Circuit Applications; 44 pages (Sep. 2022).

*Primary Examiner* — Syed I Gheyas
(74) *Attorney, Agent, or Firm* — Andrew C. Milhollin

(57) ABSTRACT

A semiconductor device, such as a heterojunction bipolar transistor (HBT), may include an extrinsic base region an intrinsic base region, and a lateral base link region disposed between and in contact with each of the extrinsic base region and an intrinsic base region. The extrinsic base region, the lateral base link region, and a portion of the intrinsic base region each may be formed on a passivation layer disposed over an isolation region and a collector region of a substrate of the semiconductor device. The extrinsic base region and a first portion of the lateral base link region may be formed from polycrystalline semiconductor material. The intrinsic base region and a second portion of the lateral base link region may be formed from monocrystalline semiconductor material. The lateral base link region may be formed after formation of the extrinsic base region and the intrinsic base region.

19 Claims, 17 Drawing Sheets

(56) References Cited

U.S. PATENT DOCUMENTS

2011/0309471 A1* 12/2011 Camillo-Castillo ........................ H10D 10/054
257/E29.174
2022/0068911 A1* 3/2022 Sinha ................ H01L 21/28518

* cited by examiner

SEMICONDUCTOR DEVICE WITH LATERAL BASE LINK REGION

TECHNICAL FIELD

Embodiments of the subject matter described herein relate generally to transistor devices, including bipolar junction transistors (BJTs) and heterojunction bipolar transistors (HBTs).

BACKGROUND

Semiconductor devices find application in a wide variety of electronic components and systems. Moreover, useful semiconductor devices for radio frequency (RF), microwave, and millimeter wave applications may include BJTs, HBTs, and related devices. In particular, HBTs are useful in high frequency applications because of their fast transit time, high cutoff frequency, high gain, and good linearity properties. These HBTs act as active gain elements and find applications as active devices in RF, microwave, and millimeter wave power amplifiers, oscillators, and other useful electronic components.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a method includes steps of providing a substrate that includes an isolation region that includes dielectric material and a collector region that includes semiconductor material, and a passivation layer disposed on the substrate, forming an extrinsic base layer on the passivation layer, forming an intrinsic base layer over the collector region, and forming a lateral base link region between the extrinsic base layer and the intrinsic base layer. The lateral base link region is disposed on the passivation layer and directly contacts respective side surfaces of the extrinsic base layer and the intrinsic base layer. The lateral base link region is separated from the collector region by at least the passivation layer.

In one or more embodiments, the extrinsic base layer includes polycrystalline semiconductor material, the intrinsic base layer includes monocrystalline semiconductor material, and the lateral base link region includes a first portion that includes monocrystalline semiconductor material and a second portion that includes polycrystalline semiconductor material.

In one or more embodiments, the first portion of the lateral base link region directly contacts the intrinsic base layer and the second portion of the lateral base link region directly contacts the extrinsic base layer.

In one or more embodiments, the polycrystalline semiconductor material of each of the extrinsic base layer and the first portion of the lateral base link region is selected from the group consisting of polycrystalline silicon and polycrystalline silicon germanium, and the monocrystalline semiconductor material of each of the intrinsic base layer and the second portion of the lateral base link region is selected from the group consisting of monocrystalline silicon and monocrystalline silicon germanium.

In one or more embodiments, the method includes steps of forming a first dielectric stack on the extrinsic base layer, forming an emitter window by etching a first opening in the first dielectric stack and the extrinsic base layer, where the first opening exposes a portion of the isolation region, forming an oxide layer over the first dielectric stack, and removing portions of the oxide layer via a first anisotropic etch process to form a spacer corresponding to a remaining portion of the oxide layer. The spacer is disposed in contact with a side surface of the first dielectric stack and a top surface of the passivation layer.

In one or more embodiments, the method includes steps of removing the portion of the isolation region exposed by the first opening to expose a surface of the collector region, forming a launcher layer on the exposed surface of the collector region via selective epitaxial growth, where forming the intrinsic base layer over the collector region includes forming the intrinsic base layer on the launcher layer via selective epitaxial growth, and forming an emitter cap layer on the intrinsic base layer. The emitter cap layer and the launcher layer each include silicon.

In one or more embodiments, the method includes steps of forming an emitter layer on the emitter cap layer, and forming a second dielectric stack on the emitter layer, where the emitter layer includes polycrystalline semiconductor material, each of the emitter layer and the second dielectric stack are disposed at least partially in the emitter window, and a portion of the emitter layer is disposed on the spacer.

In one or more embodiments, the method includes a step of forming an outside spacer in contact with at least a side surface and a bottom surface of the emitter layer. A portion of the outside spacer includes a portion of a first layer of the first dielectric stack.

In one or more embodiments, the method includes a step of concurrently removing the spacer, a second layer of the first dielectric stack, and a first layer of the second dielectric stack. Removal of the spacer forms a second opening that is disposed between the passivation layer and the emitter layer.

In one or more embodiments, the step of forming the lateral base link region includes forming the lateral base link region in the second opening via selective epitaxial growth of one or more semiconductor materials, respectively, on each of a side surface of the intrinsic base layer and a side surface of the extrinsic base layer.

In an example embodiment, a transistor includes a substrate including a collector region that includes semiconductor material and an isolation region that includes first dielectric material, a dielectric layer that includes second dielectric material, where the dielectric layer is formed over the substrate, a first semiconductor layer disposed on the dielectric layer overlapping the isolation region, a second semiconductor layer disposed over the collector region, where at least a portion of the second semiconductor layer is disposed on the dielectric layer, a third semiconductor layer disposed on the dielectric layer between the first semiconductor layer and the second semiconductor layer, and a fourth semiconductor layer disposed over the second semiconductor layer and the third semiconductor layer.

In one or more embodiments, the first semiconductor layer corresponds to an extrinsic base region, the second semiconductor layer corresponds to an intrinsic base region, the third semiconductor layer corresponds to a lateral base link region, and the fourth semiconductor layer corresponds to an emitter region.

In one or more embodiments, the first semiconductor layer includes semiconductor material selected from the group consisting of polycrystalline silicon and polycrystalline silicon germanium, the second semiconductor layer includes semiconductor material selected from the group consisting of monocrystalline silicon and monocrystalline silicon germanium, the third semiconductor layer includes a first portion that includes semiconductor material selected from the group consisting of monocrystalline silicon and monocrystalline silicon germanium, and the third semiconductor layer includes a second portion that includes semiconductor material selected from the group consisting of polycrystalline silicon and polycrystalline silicon germanium.

In one or more embodiments, the transistor device includes a fifth semiconductor layer disposed between the collector region and the second semiconductor layer and a sixth semiconductor layer disposed between the second semiconductor layer and the fourth semiconductor layer.

In one or more embodiments, the fifth semiconductor layer corresponds to a launcher layer formed from silicon, and the sixth semiconductor layer corresponds to an emitter cap layer formed from silicon.

In one or more embodiments, the transistor device includes an inside spacer disposed between the fourth semiconductor layer and the sixth semiconductor layer, the inside spacer including one or more layers of one or more dielectric materials, and an outside spacer disposed in contact with a side surface of the fourth semiconductor layer and a bottom surface of the fourth semiconductor layer.

In one or more embodiments, the transistor device includes an oxide layer disposed on the bottom surface of the fourth semiconductor layer between the inside spacer and the outside spacer.

In one or more embodiments, the oxide layer is disposed overlapping the third semiconductor layer and is separate from the third semiconductor layer.

In one or more embodiments, the third semiconductor layer is separated from the collector region by at least the dielectric layer.

In one or more embodiments, the third semiconductor layer has a first dopant concentration that is greater than a second dopant concentration of the second semiconductor layer.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
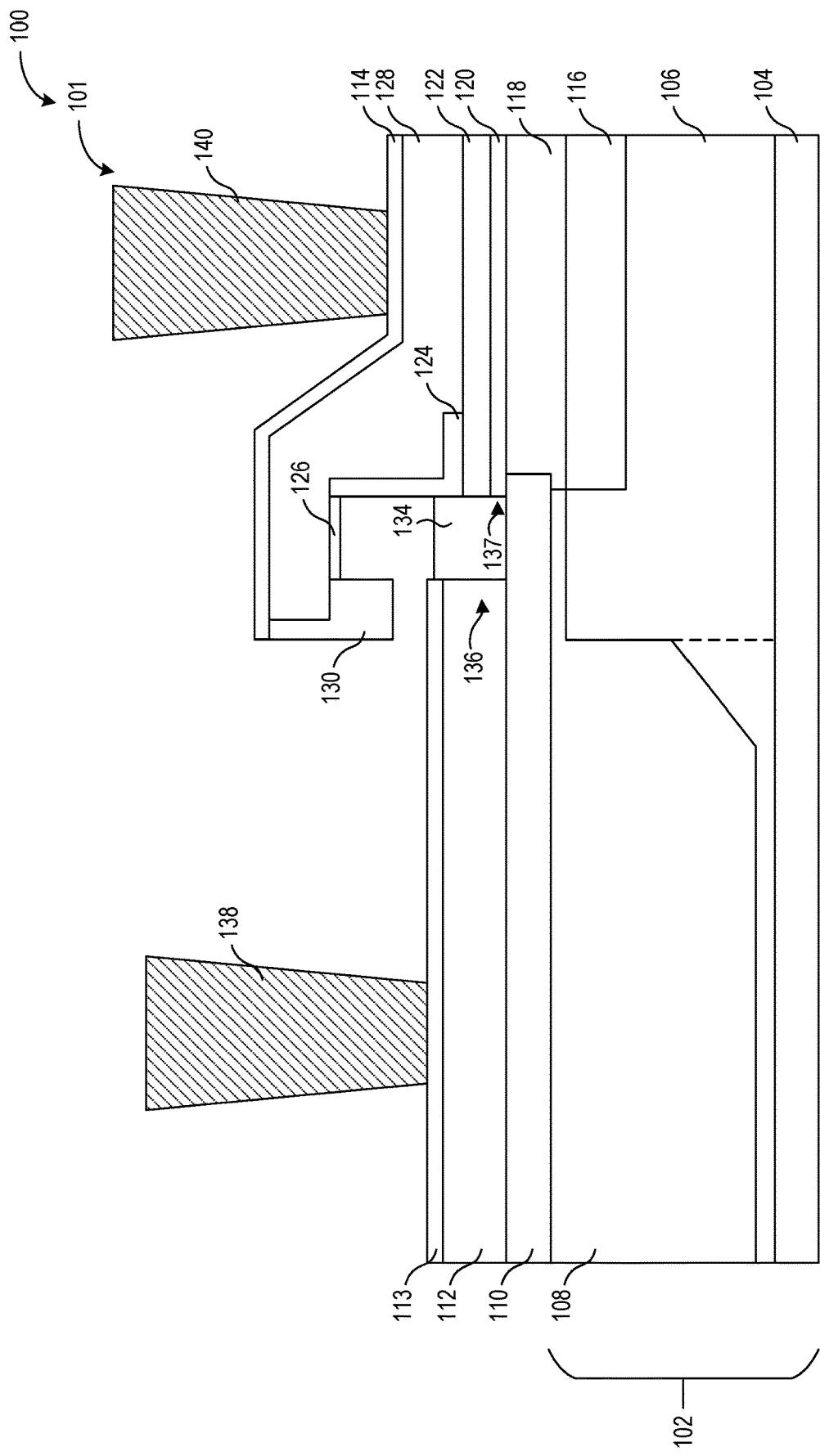
FIG. 1 is a cross sectional side view of a transistor device, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein address the above challenges by providing a transistor, such as a heterojunction bipolar transistor (HBT) and an associated fabrication method in which a lateral base link region is formed between the extrinsic base layer and intrinsic base layer of the HBT. HBT devices typically have a maximum oscillation frequency that is limited by two primary parasitic components: base resistance (i.e., the resistance between the base electrode of the HBT and the intrinsic base region) and collector-base junction capacitance (i.e., the capacitance between the base region of the HBT and the collector region of the HBT. The design and fabrication of HBT devices typically results in a trade-off between the base resistance and collector-base junction capacitance. For example, higher doped, deeper extrinsic base junctions in an HBT tend to result decrease base resistance but result in higher-doped collector junctions, leading to increased collector-base junction capacitance.

Some conventional HBT structures typically include a base link region disposed on the extrinsic base region and connected to a side surface of the intrinsic base region or a base link region disposed under the extrinsic base region and connected to a sidewall of the intrinsic base region, typically resulting in high base resistance due to vertical and horizontal resistance between the intrinsic base region and the extrinsic base region through the base link region. Other conventional HBT structures include a lateral base link region that is disposed directly between the extrinsic base region and the collector region of the HBT, typically resulting in undesirably high collector-base junction capacitance.

In one or more embodiments described herein, an HBT device includes a lateral base link region that laterally couples the intrinsic base region of the HBT device to the extrinsic base region of the HBT. That is, the lateral base link region may extend between a side surface of the extrinsic base region and a side surface of the intrinsic base region. For example, each of the extrinsic base region, the lateral base link region, and a portion of the intrinsic base region may be formed on an upper surface of a passivation layer disposed on a substrate of the HBT device. In one or more embodiments, the lateral base link region may be formed independently from the extrinsic base region and the intrinsic base region. In one or more embodiments, the intrinsic base region may be formed, completely or partially, from monocrystalline silicon (e.g., which may advantageously reduce base resistance of the HBT device). The lateral base link region may be formed (e.g., via selective epitaxial growth) after formation of the intrinsic base region and the extrinsic base region, and may include a first portion that is polycrystalline and a second portion that is monocrystalline, where the presence of monocrystalline material in the lateral base link region may advantageously reduce base resistance of the HBT device. The lateral base link region may be separated from the collector region of the HBT device by at least the passivation layer, which may advantageously reduce collector-base capacitance of the HBT device.

FIG. 1 is a cross-sectional side view 100 of a transistor device 101, according to an embodiment. The transistor device 101 may include a base substrate 102 that includes at least a buried layer 104, a collector region 106, an isolation region 108. The base substrate 102 may include one or more regions of semiconductor material (e.g., the buried layer 104, the collector region 106), where such regions of semiconductor material may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In some embodiments, one or more regions of semiconductor material (e.g., the buried layer 104, the collector region 106) of the base substrate 102 may include semiconductor regions that are formed via ion implantation or that are grown via epitaxial growth. In one or more embodiments, the base substrate 102 may be a Silicon on Insulator (SOI) substrate that includes a buried oxide layer disposed between a base silicon substrate and a top silicon layer.

It should be understood that only a portion of the base substrate 102 is shown in the present example. For example, elements that may be included in the base substrate 102 and that are not shown here may include additional semiconductor regions (as described above), back-side metallization (e.g., a reference plane), and/or one or more metallized through-substrate vias.

In one or more embodiments, the transistor device 101 may be a heterojunction bipolar transistor (HBT) that includes the collector region 106, an intrinsic base region 120 (sometimes referred herein to as the "intrinsic base layer 120") that is disposed over the collector region 106, an extrinsic base region 112 (sometimes referred to herein as the "extrinsic base layer 112") that partially overlaps the collector region 106 and at least partially overlaps the isolation region 108, and an emitter region 128 (sometimes referred to herein as the "emitter layer 128" that is disposed over the intrinsic base region 120. In one or more embodiments, the collector region 106, the intrinsic base region 120, the extrinsic base region 112, and the emitter region 128 may include one or more of Si, Ge, SiGe, or silicon-germanium-carbon (SiGeC). In one or more other embodiments, the collector region 106, the intrinsic base region 120, the extrinsic base region 112, and the emitter region 128 may include one or more of Si, Ge, SiGe, GaAs, GaN, AlN, InN, InGaP, and/or other suitable semiconductor materials.

In one or more embodiments, the transistor device 101 may be configured as a npn transistor such that the collector region 106 and the emitter region 128 include n-type semiconductor material and the intrinsic base region 120 and the extrinsic base region 112 may each include p-type semiconductor material. In such embodiments, the buried layer 104 may be a heavily doped N+ buried layer (e.g., with an n-type dopant concentration in a range of around 1e19 $cm^{-3}$ to around 1e21 $cm^{-3}$ although higher or lower dopant concentrations may be used). In other embodiments, the transistor device 101 may be configured as a pnp transistor such that the collector region 106 and the emitter region 128 may include a p-type semiconductor and the intrinsic base region 120 and the extrinsic base region 112 may each include n-type semiconductor material. As used herein, the term "n-type semiconductor material" refers to a semiconductor material with a net electron concentration ranging from about 1e15 $cm^{-3}$ to about 1e21 $cm^{-3}$, though other higher or lower electron concentrations may be used. As used herein, the term "p-type semiconductor material" refers to a semiconductor material with a net hole concentration ranging from about 1e15 $cm^{-3}$ to about 1e21 $cm^{-3}$, though other higher or lower hole concentrations may be included.

In one or more embodiments, the collector region 106 may have a total thickness of between around 1,000 angstroms and around 3,000 angstroms. In one or more embodiments, the collector region 106 may have a total thickness of between around 100 angstroms and around 10,000 angstroms, though other thicknesses may be used. For embodiments in which the collector region 106 includes n-type semiconductor material (e.g., embodiments in which the transistor device 101 is a npn transistor), the collector region 106 may be doped with one or more of phosphorous (P), arsenic (As), antimony (Sb), lithium (Li), or other suitable n-type dopants. For embodiments in which the collector region 106 includes p-type semiconductor material (e.g., embodiments in which the transistor device 101 is a pnp transistor), the collector region 106 may be doped with one or more of carbon (C), boron (B), oxygen (O), or indium (In) or other suitable p-type dopants.

Herein, the term "n-type dopant" refers to material that, upon being integrated into (e.g., diffused through) a semiconductor crystal lattice structure, provides ("donates") free electrons in the lattice structure, such that electrons become the majority charge carrier in the lattice structure. Such n-type dopants include P, As, Sb, and Li as non-limiting examples. Herein, the term "p-type dopant" refers to material that are electron acceptors and that, upon being integrated into (e.g., diffused through) a semiconductor crystal lattice structure, introduce holes (sometimes referred to as "electron holes") in the lattice structure, such that holes become the majority charge carrier in the lattice structure. Such p-type dopants include C, B, O, and In as non-limiting examples.

In one or more embodiments, regardless of the dopant type (n-type or p-type) of the collector region 106, at least a portion of the collector region 106 may be doped to have a dopant concentration of between about $5e18$ cm$^{-3}$ and about $5e20$ cm$^{-3}$, although other higher or lower dopant concentrations may be used. In one or more embodiments, the collector region 106 may include multiple doped regions, each having respectively different doping concentrations (e.g., within the previously described range of dopant concentrations or another suitable range of dopant concentrations). For example, the collector region 106 may include an implanted region 116, which may be a selectively implanted collector (SIC) region formed via ion implantation (e.g., self-aligned to an emitter window, as described in more detail below). In one or more embodiments, regardless of dopant type, the implanted region 116 may have a dopant concentration in a range of around $1e16$ cm$^{-3}$ to around $1e19$ cm$^{-3}$ although higher or lower dopant concentrations may be used. For example, the dopant concentration of the implanted region 116 may be selected to achieve a desired collector-base junction breakdown voltage. For example, the collector region 106 may have a dopant concentration that is between that of the buried layer 104 and the implanted layer 116. In one or more embodiments, the implanted region 116 may be omitted, in which case the collector region 106 extends into the area in which the implanted region 116 is shown to be disposed in the present example. The collector region 106 may be coupled to a collector electrode (not shown).

The isolation region 108 may be disposed laterally adjacent to the collector region 106, such that a sidewall (i.e., side surface) of the isolation region 108 is in direct contact with a sidewall (i.e., side surface) of the collector region 106. In one or more embodiments, a portion of the isolation region 108 may extend over a portion of the collector region 106. In one or more embodiments, the isolation region 108 may include one or more of silicon dioxide (SiO$_2$), tetraethyl orthosilicate (TEOS), silicon nitride (SiN), silicon oxynitride (SiON), aluminum oxide (Al$_2$O$_3$), aluminum nitride (AlN), spin-on glass, or other suitable dielectric material(s). The buried layer 104 may be disposed below the collector region 106 and the isolation region 108, and the buried layer 104 may be separated from the isolation region 108 by the collector region 106 (and/or other semiconductor material that may be disposed adjacent to the collector region 106).

A launcher layer 118 (sometimes referred to as a "semiconductor launcher layer 118" or as a "buffer layer 118") may be formed over the collector region 106 (e.g., directly on an upper surface of the collector region 106 or directly on the implanted region 116 if present). In one or more embodiments, the launcher layer 118 may include a low-doped (e.g., between around $1e16$ cm$^{-3}$ and about $1e18$ cm$^{-3}$, although other higher or lower dopant concentrations may be used) undoped semiconductor material (e.g., silicon). The launcher layer 118 may have the same doping type (e.g., n-type or p-type) as the collector region 106, for embodiments in which the launcher layer 118 is doped. The launcher layer 118 may be configured to increase the velocity of electrons injected into the collector region 106 in one or more embodiments. In one or more embodiments, the launcher layer may be an undoped monocrystalline silicon layer that is epitaxially grown on the collector region 106.

The intrinsic base region 120 may be formed over the collector region 106 (e.g., epitaxially grown directly on the launcher layer 118). In one or more embodiments, the intrinsic base region 120 is formed using Si$_{1-x}$Ge$_x$ where X is the Ge mole fraction. In one or more embodiments, one or more portions of the intrinsic base region 120 may have a narrower bandgap than the emitter region 128 and the collector region 106. In one or more embodiments, the bandgap of the one or more portions of the intrinsic base region 120 may be adjusted by changes in the Ge mole fraction. In one or more embodiments, the Ge mole fraction, X, may vary between about 0.05 and about 0.3 though other larger or smaller values of X may be used. In one or more embodiments, the value of the Ge mole fraction may be constant throughout the intrinsic base region 120. In still other embodiments, the bandgap of the intrinsic base region 120 may be continuously graded. In these embodiments, the material of the intrinsic base region 120 (e.g., Si$_{1-x}$Ge$_x$) may be graded by forming an upper portion of the intrinsic base region 120 with a wider bandgap and continuously reducing to a narrower bandgap in a lower portion of the intrinsic base region 120.

In one or more embodiments, a SiGe:C collector-base spacer (not shown) may be formed between intrinsic base region 120 and the launcher layer 118. The SiGe:C collector-base spacer may be undoped. In one or more embodiments, a SiGe:C base-emitter spacer (not shown) may be formed on the intrinsic base region 120 (e.g., between the intrinsic base region 120 and the emitter cap layer 122). The SiGe:C base-emitter spacer may be doped or may be undoped, according to various embodiments. In one or more embodiments, the intrinsic base region 120 may include boron-doped SiGe:C. In one or more such embodiments, the SiGe:C material of any of the collector-base spacer, base-emitter spacer, and the intrinsic base region 120 may have respective carbon content of around 0.1% and germanium content of around 30%. In such embodiments, the carbon content of the SiGe:C material of any of the collector-base spacer, the base-emitter spacer, and/or the intrinsic base region 120 may prevent or reduce undesirable diffusion of dopant impurities out of the intrinsic base region 120.

In one or more embodiments in which the transistor device 101 is a pnp transistor, the intrinsic base region 120 may include n-type semiconductor material, such as semiconductor material doped with P, As, Sb, Li, or another suitable n-type dopant. In one or more embodiments in which the transistor device 101 is a npn transistor, the intrinsic base region 120 may include p-type semiconductor material, such as semiconductor material doped with C, B, O, In, or another suitable p-type dopant. The dopant concentration of the intrinsic base region 120 may be in a range of around $5e17$ cm$^{-3}$ to $1e21$ cm$^{-3}$, although higher or lower dopant concentrations may be used.

The extrinsic base region 112 may be formed over the base substrate 102. As shown in the present example, a first portion of the extrinsic base region 112 may be formed directly over the isolation region 108 and a second portion of the extrinsic base region 112 may be formed directly over the collector region 106. In one or more embodiments, the extrinsic base region 112 may be formed from polycrystalline semiconductor material, such as polycrystalline silicon. In one or more embodiments, the extrinsic base region 112 may be formed from amorphous semiconductor material, such as amorphous silicon or amorphous SiGe. In one or more embodiments in which the transistor device 101 is a pnp transistor, the extrinsic base region 112 may include n-type semiconductor material, such as semiconductor material doped with P, As, Sb, Li, or another suitable n-type dopant. In one or more embodiments in which the transistor device 101 is a npn transistor, the extrinsic base region 112 may include p-type semiconductor material, such as semiconductor material doped with C, B, O, In, or another suitable p-type dopant. The dopant concentration of the extrinsic base region 112 may be in a range of around $1e20$ $cm^{-3}$ to $1e21$ $cm^{-3}$, although higher or lower dopant concentrations may be used.

One or more dielectric layers, such as a passivation layer 110, may be interposed between the extrinsic base region 112 and the base substrate 102. The passivation layer 110 may at least partially separate and electrically insulate the extrinsic base region 112 from the collector region 106. For example, the passivation layer 110 may be formed from dielectric material, such as $SiO_2$, TEOS, SiN, SiON, $Al_2O_3$, AlN, spin-on glass, or other suitable dielectric material(s). In one or more embodiments, the passivation layer 110 may be formed from a dielectric material that is different from that of the isolation region 108. For example, the isolation region 108 may be formed from TEOS and the passivation layer 110 may be formed from nitride material (e.g., AlN or SiN). The extrinsic base region 112 may be coupled to the intrinsic base region 120 by a lateral base link region 134 that includes semiconductor material formed over the passivation layer 110. For example, a sidewall 136 (sometimes referred to as the "side surface 136") of the extrinsic base region 112 may directly contact a first sidewall (i.e., side surface) of the lateral base link region 134 and a sidewall 137 (sometimes referred to as the "side surface 137") of the intrinsic base region 120 may directly contact a second sidewall 137 of the lateral base link region 134. The lateral base link region 134 may be doped with the same type of dopant as the extrinsic base region 112 and may be in a range of around $1e18$ $cm^{-3}$ to $1e21$ $cm^{-3}$, although higher or lower dopant concentrations may be used.

In one or more embodiments, the lateral base link region 134 may include a first portion that is formed from the same semiconductor material as that of the intrinsic base region 120 (e.g., monocrystalline semiconductor material such as monocrystalline SiGe) and a second portion that is formed from the same semiconductor material as the extrinsic base region 112 (e.g., polycrystalline or amorphous semiconductor material such as polycrystalline or amorphous silicon or SiGe). In one or more embodiments, portions of each of the extrinsic base region 112, the lateral base link region 134, and the intrinsic base region 120 may be disposed directly on the top surface of the passivation layer 110.

The extrinsic base region 112 may be coupled to a base electrode 138 via a contact layer 113, which may be formed using one or more of titanium-tungsten (TiW), titanium tungsten nitride (TiWN), tungsten silicide (WSi), cobalt silicide (CoSi), platinum silicide (PtSi), nickel platinum silicide (NiPtSi), or one or more other suitable material(s). In one or more embodiments, the contact layer 113 may be formed via silicidation. The base electrode 138 may be formed from copper, aluminum, tungsten, or another suitable conductive material, for example.

The emitter region 128 may be formed over the intrinsic base region 120. In one or more embodiments in which the transistor device 101 is a npn transistor, the emitter region 128 may be formed using n-type semiconductor material, such as semiconductor material doped with one or more of P, As, Sb, Li, or another suitable n-type dopant. In one or more embodiments in which the transistor device 101 is a pnp transistor, the emitter region 128 may be formed using p-type semiconductor material, such as semiconductor material doped with one or more of C, B, O, In, or another suitable p-type dopant. The dopant concentration of the emitter region 128 may be in a range of around $1e19$ $cm^{-3}$ to $3e21$ $cm^{-3}$, although higher or lower dopant concentrations may be used.

In one or more embodiments, the emitter region 128 includes polycrystalline semiconductor material (e.g., polycrystalline silicon). In one or more embodiments, the emitter region 128 may have a thickness of between about 100 angstroms around 1000 angstroms, although it should be understood that other suitable thicknesses may be used. The intrinsic emitter region 128 may be coupled to an emitter electrode 140 via a contact layer 114, which may be formed using one or more of TiW, TiWN, WSi, CoSi, PtSi, NiPtSi, or other suitable material(s). In one or more embodiments, the contact layer 114 may be formed via silicidation. The emitter electrode 140 may be formed from copper, aluminum, tungsten, or another suitable conductive material, for example.

An emitter cap layer 122 may be formed over (e.g., directly on) the intrinsic base region 120 and may be disposed beneath the emitter region 128. The emitter cap layer 122 may form a portion of the emitter-base junction. In one or more embodiments, the emitter cap layer 122 may be undoped. In or more other embodiments, the emitter cap may be doped with the same type of dopant (i.e., n-type or p-type) as the intrinsic base region 120 and may have a dopant concentration in a range of around $1e17$ $cm^{-3}$ to around $1e18$ $cm^{-3}$, although higher or lower dopant concentrations may be used An inside spacer 124 may be disposed between the emitter layer 128 and each of the lateral base link region 134 and a portion of the emitter cap layer 122. The inside spacer 124 may include one or more dielectric layers and may provide electrical insulation between the emitter layer 128 and each of the lateral base link region 134 and a portion of the emitter cap layer 122. In one or more embodiments, the inside spacer 124 includes multiple dielectric layers, such as an oxide-nitride-oxide (ONO) stack. In one or more other embodiments, the inside spacer 124 may be formed from one or more layers including one or more of $SiO_2$, TEOS, SiN, SiON, $Al_2O_3$, AlN, spin-on glass, or other suitable dielectric material(s).

An outside spacer 130 may be disposed in contact with a side surface of the emitter region 128 and a portion of the bottom surface of the emitter region 128. The outside spacer 130 may be formed from one or more dielectric materials such as $SiO_2$, TEOS, SiN, SiON, $Al_2O_3$, AlN, other suitable dielectric material(s). Dielectric material 126 (sometimes referred to as an "oxide layer 126") may be formed on (e.g., directly on) a portion of the bottom side of the emitter region 128 and may extend between the inside spacer 124 and the outside spacer 130. The dielectric material 126 may be formed from different material than that of the outside spacer 130. For example, the outside spacer 130 may be formed from nitride material (e.g., AlN, SiN or another suitable nitride material) and the dielectric material 126 may be formed from oxide material (e.g., TEOS, $Al_2O_3$, or another suitable oxide material). The dielectric material 126 may reduce or otherwise mitigate undesirable formation of semiconductor material on the bottom side of the emitter region 128 when forming the lateral base link region 134 (e.g., via selective epitaxial growth).

Figure 2:
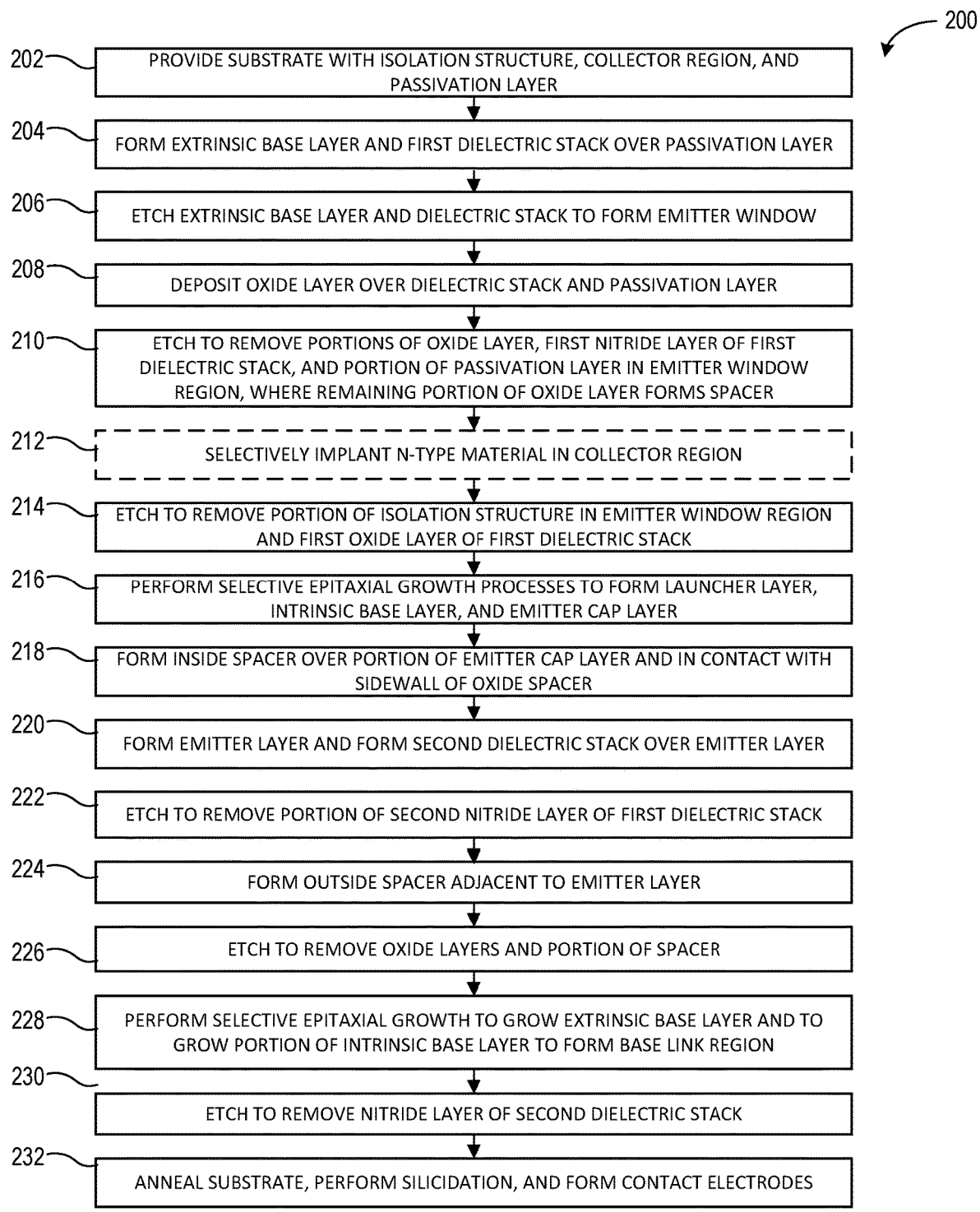
FIG. 2 is a process flow diagram describing a method for fabricating the transistor device of FIG. 1, in accordance with various embodiments.

FIG. 2 is a process flow diagram depicting a method 200 for fabricating at least a portion of a transistor device (e.g., a HBT device), such as the transistor device 101 of FIG. 1, in accordance with various embodiments. For enhanced understanding, FIG. 2 may be viewed simultaneously with FIGS. 3-17, which are cross sectional views depicting the transistor device 101 of FIG. 1 at various stages of fabrication in accordance with various embodiments.

Figure 3:
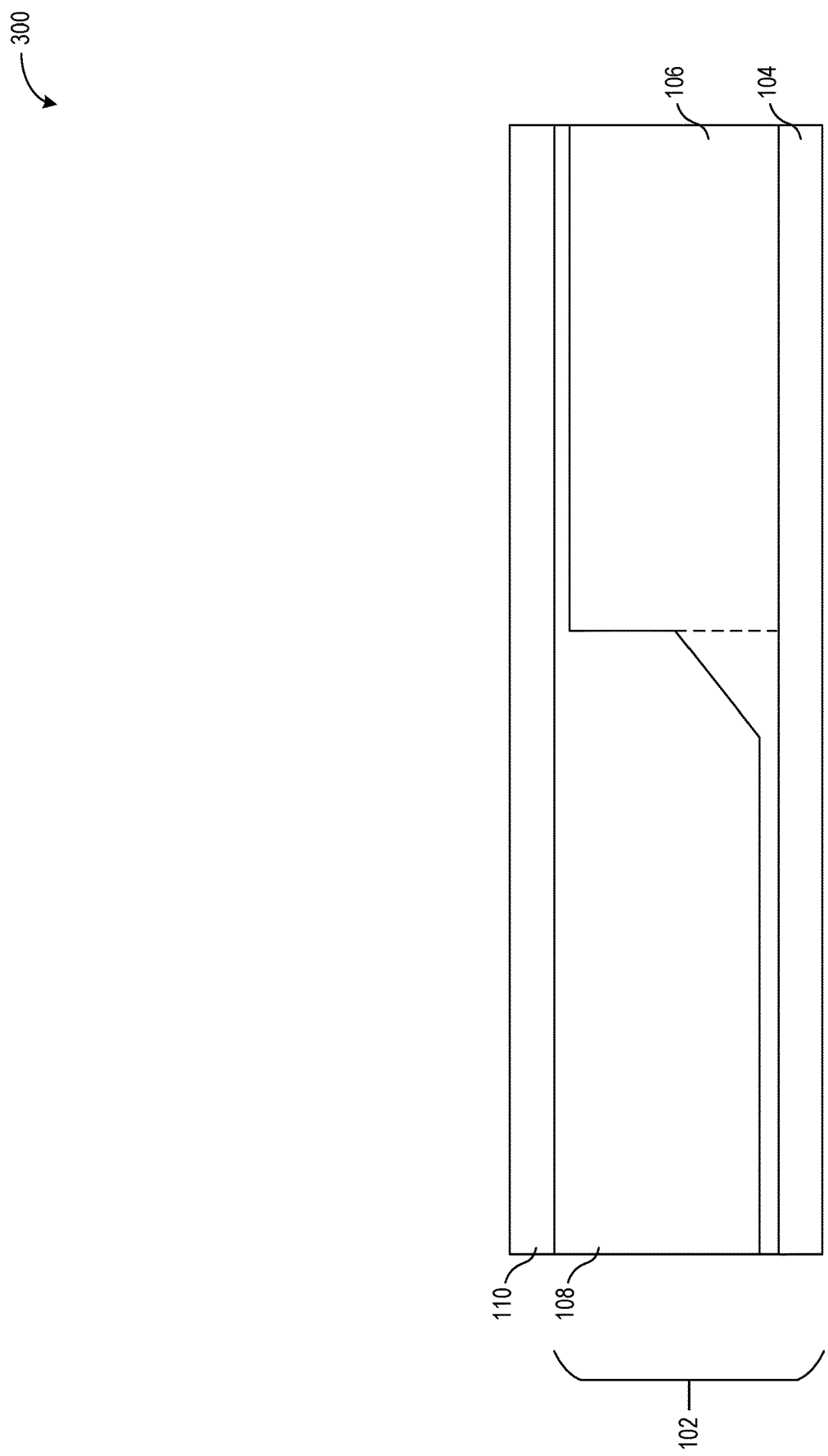
FIGS. 3-17 are cross sectional views depicting the transistor device of FIG. 1 at various stages of fabrication corresponding to, for example, steps of the method of FIG. 2, in accordance with various embodiments.

Referring first to step 202 of FIG. 2 and to FIG. 3, at a stage of fabrication 300, the base substrate 102 is provided, which includes the buried layer 104, the collector region 106, and the isolation region 108. The passivation layer 110 may be formed (e.g., deposited via sputtering, plasma deposition, chemical vapor deposition, evaporation or another suitable deposition process) on a top surface of the base substrate 102, corresponding to a top surface of the isolation region 108. In the present example, the passivation layer 110 corresponds to a nitride layer (e.g., SiN or AlN as non-limiting examples), and it should be understood that in one or more other embodiments one or more other dielectric materials may additionally or alternatively be included in the passivation layer 110, as described above.

The isolation region 108 may completely or partially separate the collector region 106 from the passivation layer 110 at the stage of fabrication 300. As described above, the present example shows only a portion of the base substrate 102, and it should be understood that the base substrate 102 may include additional portions (e.g., additional portions of the collector region 106 and the isolation region 108, silicon-on-insulator (SOI), backside metallization, through-silicon vias, and/or the like) not illustrated here. The semiconductor material of the collector region 106 may be doped with n-type dopant material or p-type dopant material prior to the stage of fabrication 300, as described above.

Figure 4:
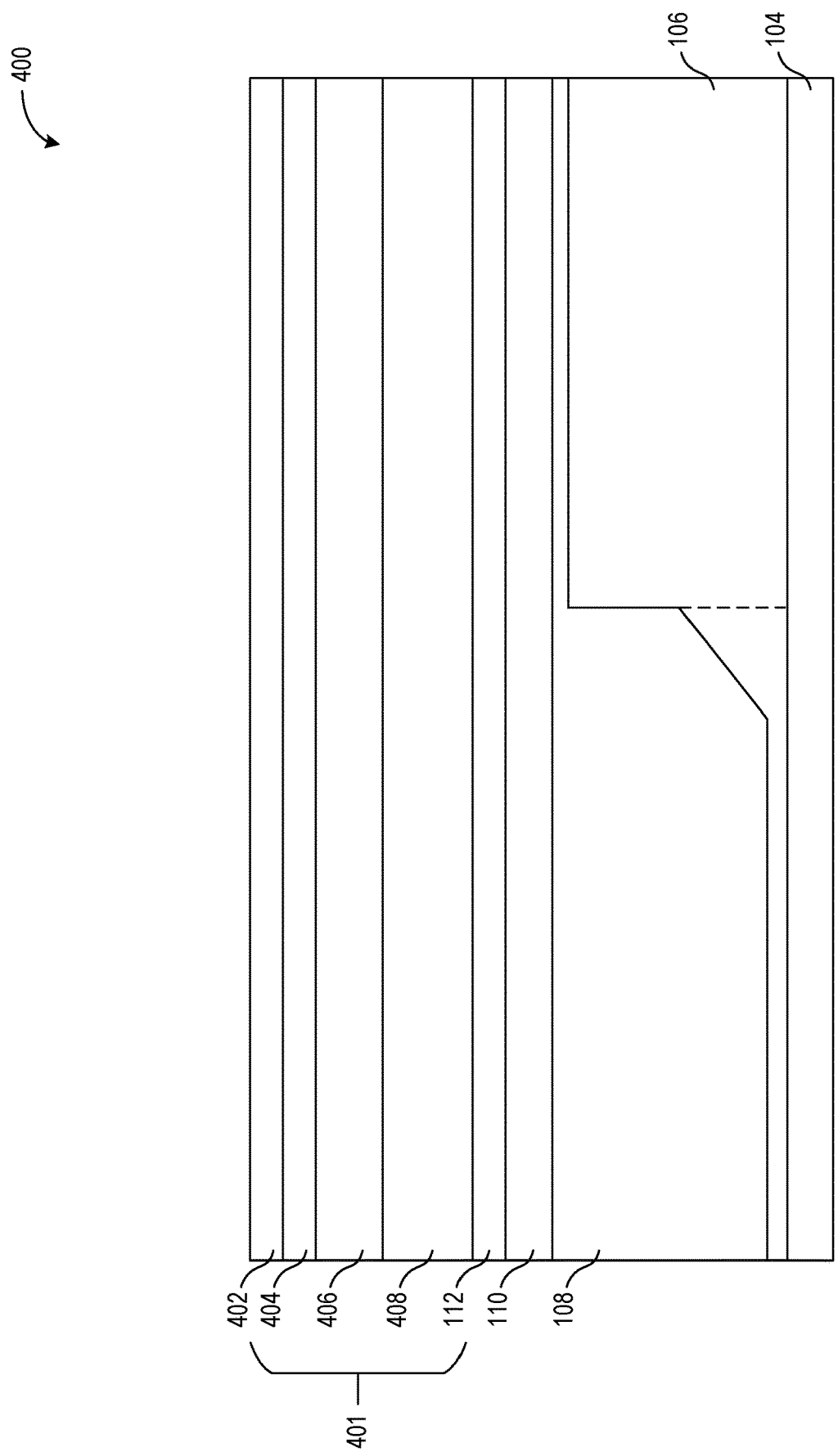

Referring next to step 204 of FIG. 2 and to FIG. 4, during a stage of fabrication 400, the extrinsic base layer 112 is formed on an upper surface of the passivation layer 110, and a first dielectric stack 401 is formed on an upper surface of the extrinsic base layer 112. The extrinsic base layer 112 may be formed on the passivation layer 110 via non-selective epitaxial growth of semiconductor material, such as polysilicon, poly-SiGe, amorphous Si, or amorphous SiGe as non-limiting examples. Herein, "non-selective epitaxial growth" of semiconductor material refers to a process (e.g., a "non-selective epitaxy" process) by which semiconductor material is epitaxially grown on any exposed non-crystalline (e.g., amorphous) surface and any exposed crystalline surface (e.g., on both dielectric material and semiconductor material). Herein, "selective epitaxial growth" of semiconductor material, for comparison, refers to a process (e.g., a "selective epitaxy" process) in which the use of material-selective chemistry increases the seeding time of the grown semiconductor material on non-crystalline (e.g., amorphous) surfaces to such an extent that the semiconductor material is grown on exposed crystalline surfaces and undergoes little or no growth non-crystalline surfaces. For non-selective epitaxy, the semiconductor material that is grown on monocrystalline surfaces has a monocrystalline structure, and the semiconductor material that is grown on non-crystalline surfaces or polycrystalline surfaces has a polycrystalline structure.

After forming the extrinsic base layer 112 and prior to forming the first dielectric stack 401, dopants may be added to the extrinsic base layer 112. These dopants may be added in-situ (during deposition of layer 112) or added by way of ion implantation. In one or more embodiments in which the transistor device 101 is a pnp transistor, the extrinsic base layer 112 may be doped with n-type dopants, such as P, As, Sb, Li, or another suitable n-type dopant. In one or more embodiments in which the transistor device 101 is a npn transistor, the extrinsic base layer 112 may be doped with p-type dopants, such as C, B, O, In, or another suitable p-type dopant. The dopant concentration of the extrinsic base layer 112 may be in a range of around $1e20$ $cm^{-3}$ to $1e21$ $cm^{-3}$, although higher or lower dopant concentrations may be used.

The first dielectric stack 401 may include a first nitride layer 402, a first oxide layer 404, a second nitride layer 406, and a second oxide layer 408, each of which may be formed via respective deposition process steps (e.g., each deposited via sputtering, plasma deposition, chemical vapor deposition, evaporation or another suitable deposition process). The first nitride layer 402 and the second nitride layer 406 may each be formed from nitride material, such as SiN or AlN, as non-limiting examples. The first oxide layer 404 and the second oxide layer 408 may each be formed from oxide material, such as $SiO_2$ or TEOS as non-limiting examples. It should be understood that these examples are intended to be illustrative and not limiting. In one or more other embodiments alternating layers of other suitable dielectric materials such as such as $SiO_2$, TEOS, SiN, SiON, $Al_2O_3$, or AlN, may be used to form the layers of the first dielectric stack 401.

Figure 5:
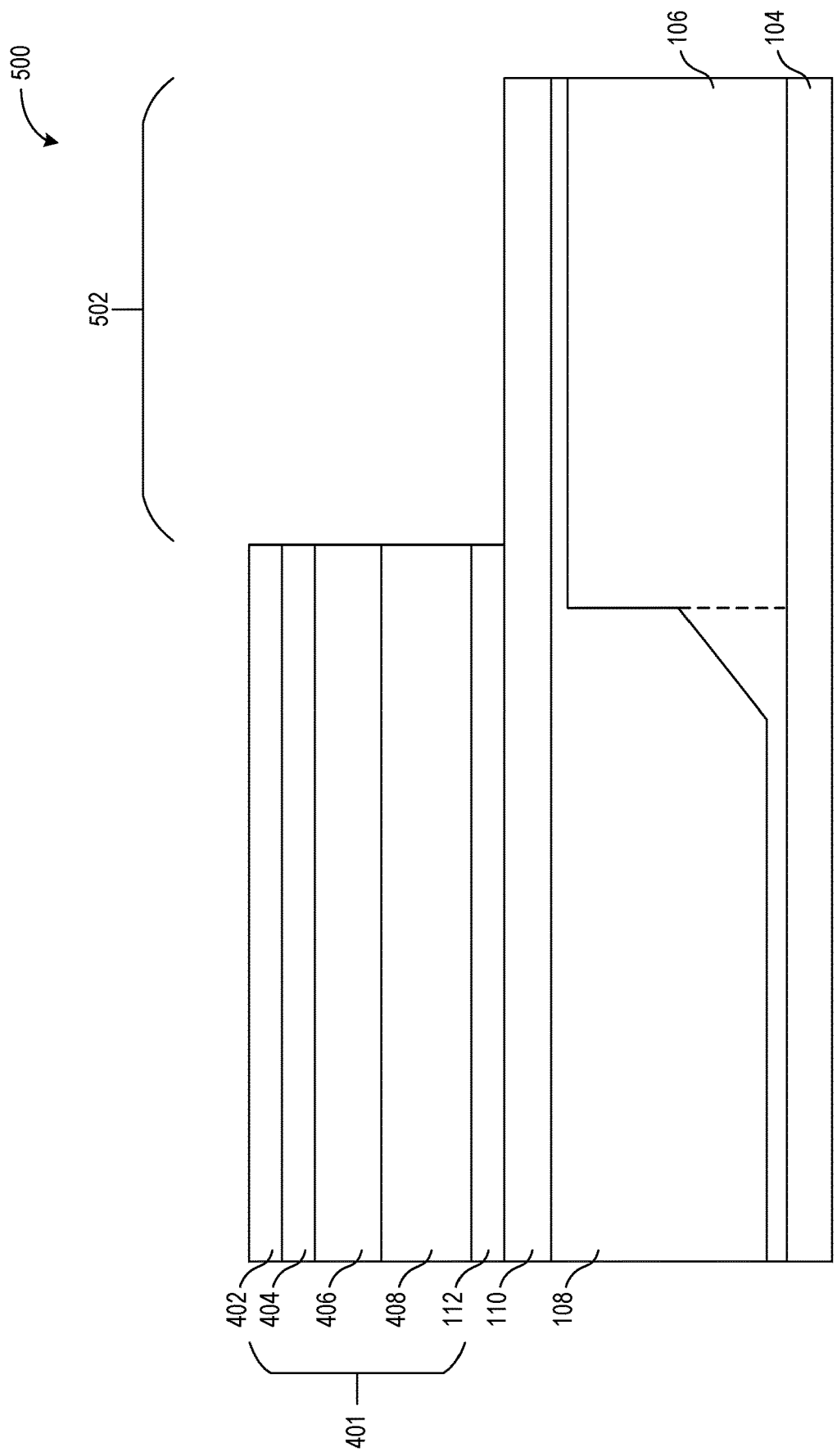

Referring next to step 206 of FIG. 2 and to FIG. 5, during a stage of fabrication 500, an opening 502 (corresponding to an emitter window in which the emitter layer 128 will subsequently be formed) is formed by etching portions of each of the layers of the first dielectric stack 401 and a portion of the extrinsic base layer 112. For example, the opening 502 may be formed using one or more etch processes, which may include one or more wet chemical etches, reactive ion etches, or other suitable etch processes. In one or more embodiments, portions of the first dielectric stack 401 that are not to be etched at the stage of fabrication 500 may be protected using patterned photoresist material (not shown), which may be removed upon completion of the etch process(es). The opening 502 may be formed over the collector region 106. Upon formation of the opening 502, a portion of the top surface of the passivation layer 110 may be exposed. In one or more embodiments, an additional isotropic etch process may be performed after formation of the opening 502 to remove (e.g., undercut) additional portions of the extrinsic base layer 112 (e.g., thereby reducing the width of the extrinsic base layer 112 and reducing the overlap between the extrinsic base layer 112 and the collector region 106).

Figure 6:
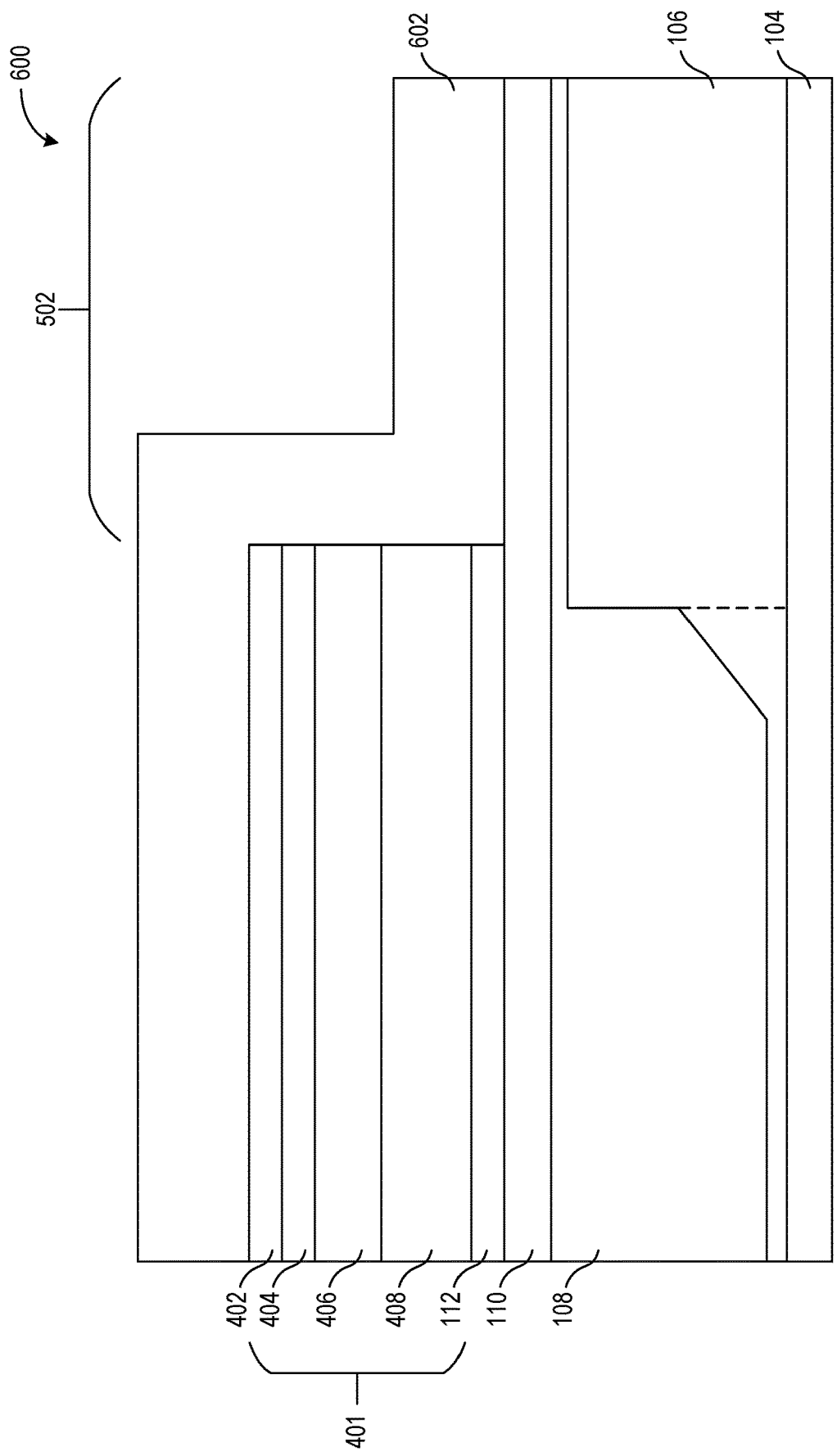

Referring next to step 208 of FIG. 2 and to FIG. 6, during a stage of fabrication 600, an oxide layer 602 (e.g., which may include $SiO_2$ or TEOS as non-limiting examples) is formed over the exposed top surface of the passivation layer 110 and side and top surfaces of the first dielectric stack 401 (e.g., in contact with side surfaces of the layers 402, 404, 406, 408 and the top surface of the layer 402). For example, the oxide layer 602 may be deposited via sputtering, plasma deposition, chemical vapor deposition, evaporation or another suitable deposition process. For example, the oxide layer 602 may have a thickness of around 100 Å to around 600 Å although higher or lower thicknesses may be used.

Figure 7:
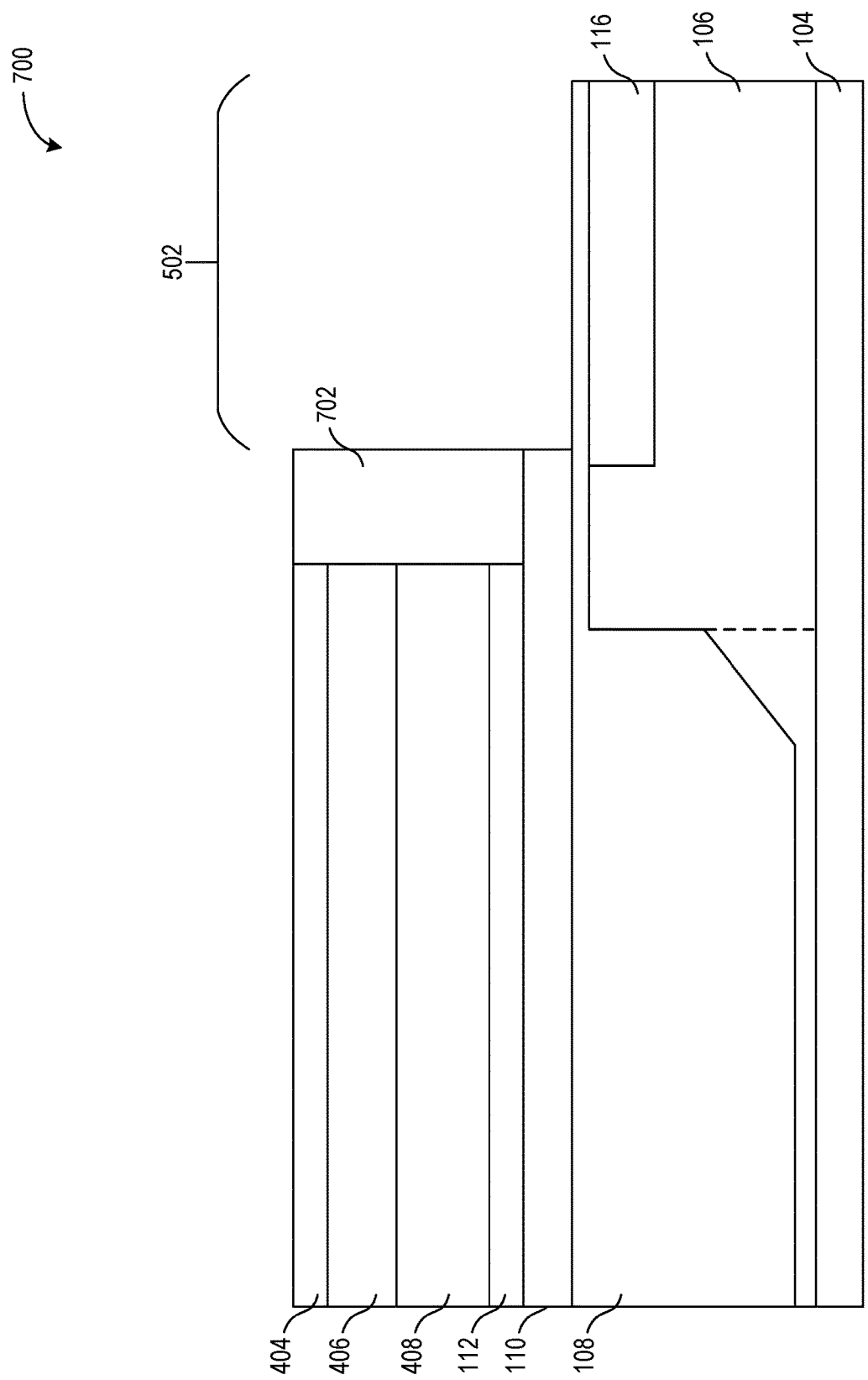

Referring next to step 210 of FIG. 2 and to FIG. 7, during a stage of fabrication 700, portions of the oxide layer 602, the passivation layer 110, and the first nitride layer 402 of the first dielectric stack 401 are removed via one or more etch processes. For example, the etch process(es) may remove a portion of the passivation layer 110 that overlaps the collector region 106 (e.g., within the opening 502), such that a portion of the isolation region 108 is exposed. In one or more embodiments, the one or more etch processes may be a single reactive ion etch (RIE) process that etches the material (e.g., oxide material) of the oxide layer 602 and the material (e.g., nitride material) of the passivation layer 110 and the first nitride layer 402 at the same or similar (e.g., within around 10% of one another) etch rates. In one or more embodiments, the one or more etch processes may include first and second etch processes, where the first etch process (e.g., a nitride-selective RIE) may etch the oxide layer 602 and the second etch process (e.g., an oxide-selective RIE) etches the first nitride layer 402 and the passivation layer 110. The etch process may be anisotropic, such that a portion of the oxide layer 602 remains adjacent to side surfaces of the layers 404, 406, and 408 upon completion of the etch process. This remaining portion of the oxide layer 602 corresponds to a spacer 702, which may reduce the width of the emitter window (i.e., the opening 502). The removal of the portion of the passivation layer 110 may increase the depth of the emitter window (i.e., the opening 502).

Referring next to step 212 of FIG. 2 and continuing to refer to the stage of fabrication 700 of FIG. 7, after completion of the etch process(es) performed at step 210, the implanted region 116 may be formed in the collector region 106 via ion implantation. For example, the implanted region 116 may be a selectively implanted collector (SIC) (e.g., that is self-aligned to the emitter window). For example, implanted ions may pass through the exposed portion of the isolation region 108 to reach the collector region 106 when forming the implanted region 116. The implanted region 116 may be doped with P, As, Sb, Li, or another suitable n-type dopant as non-limiting examples and may be of the same dopant type as the collector region 106 and the buried layer 104. In one or more embodiments, the step 212 and the corresponding implanted region 116 may be omitted.

Figure 8:
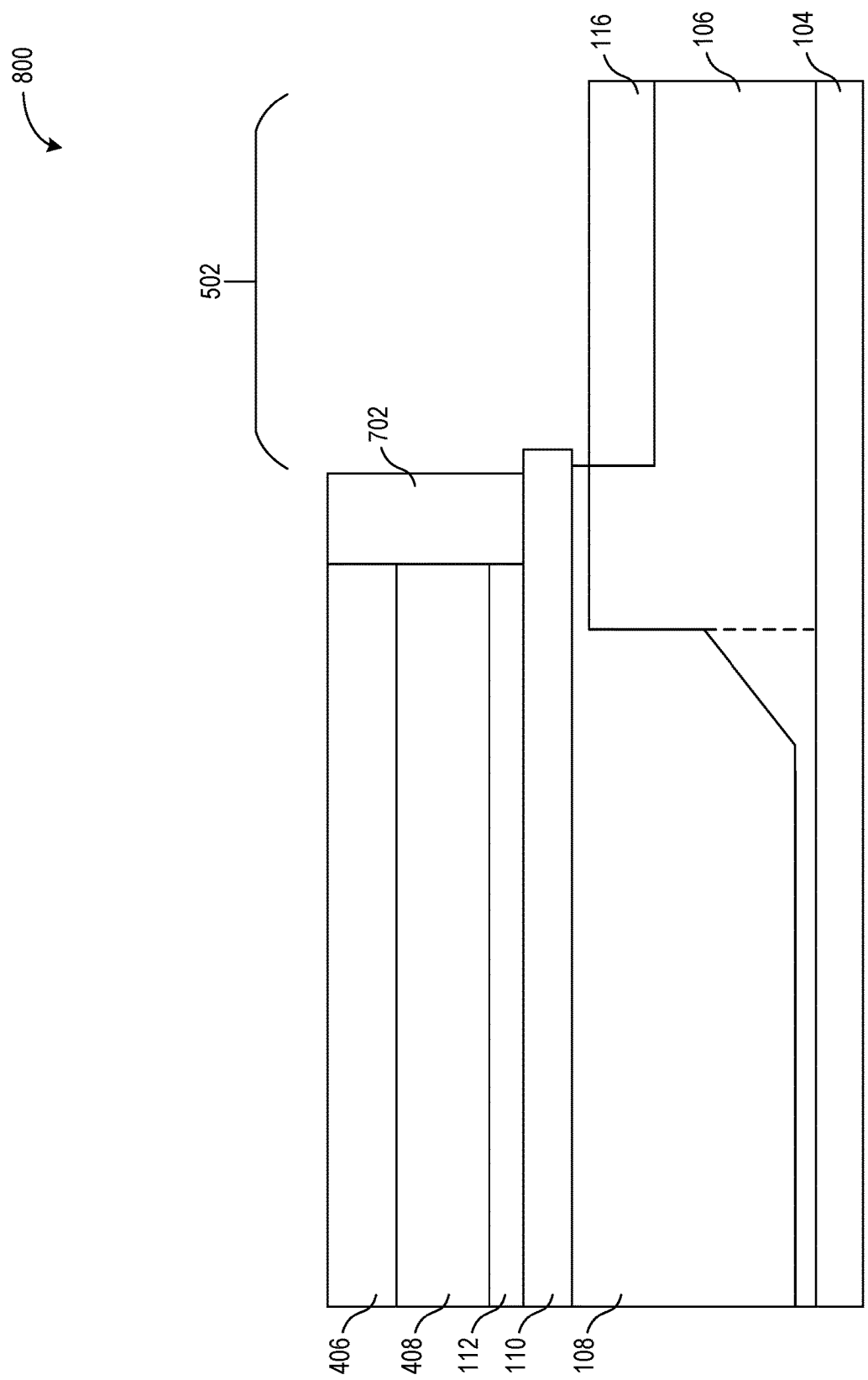

Referring next to step 214 of FIG. 2 and to FIG. 8, during a stage of fabrication 800, the first oxide layer 404 and a portion of the isolation region 108 disposed over the collector region 106 (and directly over the implanted region 116, for one or more embodiments in which the implanted region 116 is present) are removed via one or more etch processes (e.g., a buffered oxide etch as a non-limiting example). Removal of the first oxide layer 404 at this stage may expose an upper surface of the second nitride layer 406. Removal of the portion of the isolation region 108 at this stage may expose an upper surface of the collector region 106 and/or the implanted region 116, in accordance with one or more embodiments.

Figure 9:
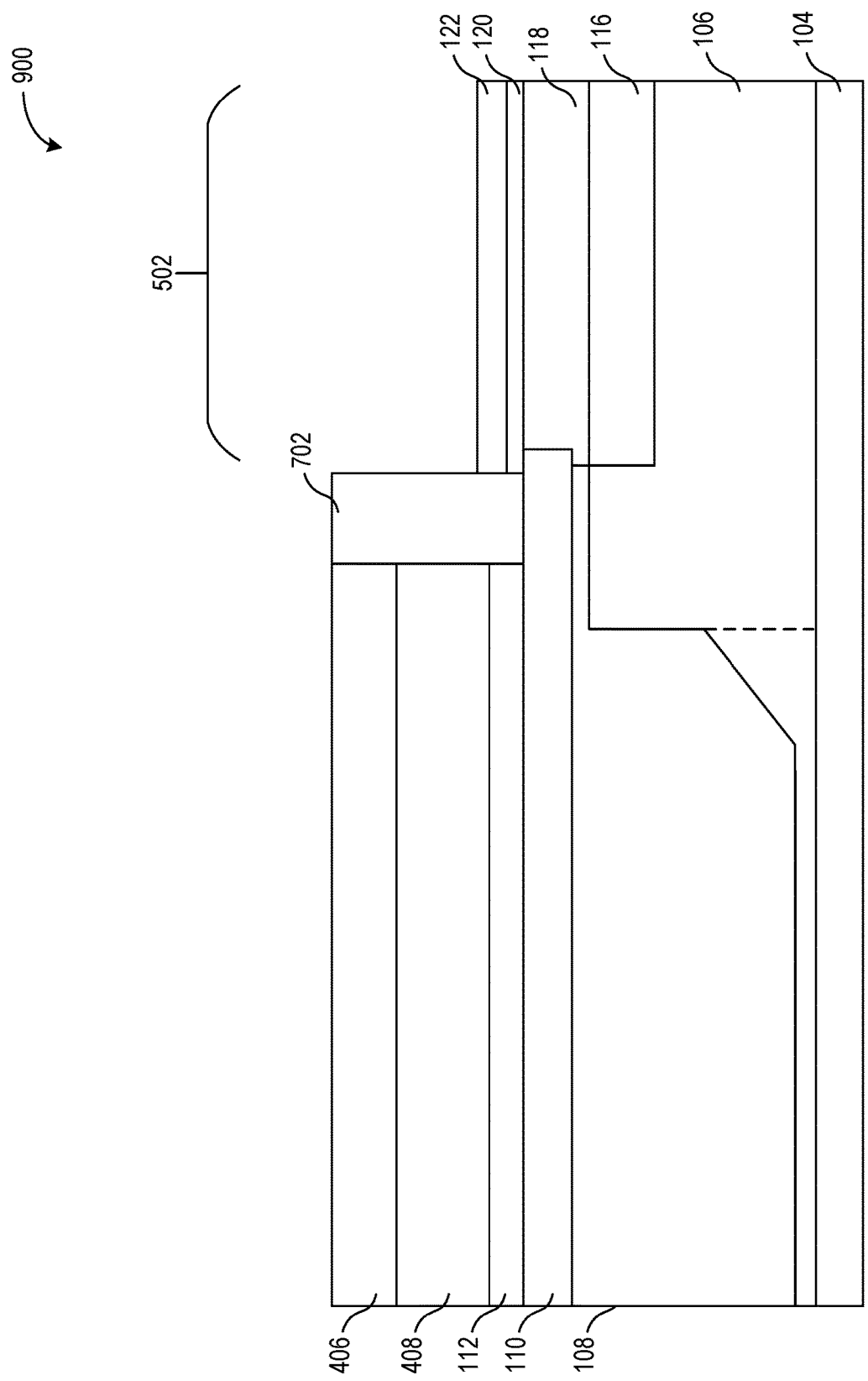

Referring next to step 216 of FIG. 2 and to FIG. 9, during a stage of fabrication 900, the launcher layer 118, the intrinsic base layer 120, and the emitter cap layer 122 are formed via a sequence of epitaxial growth processes. In one or more embodiments, the launcher layer 118 may be formed on the upper surface of the collector region 106 and/or the implanted region 116 via a selective epitaxial growth process, then the intrinsic base layer 120 may be formed on the launcher layer 118 via another selective epitaxial growth process, and then the emitter cap layer 122 may be formed on the intrinsic base region 120 via yet another selective epitaxial growth process. Each of the launcher layer 118, the intrinsic base layer 120, and the emitter cap layer 122 may be formed, respectively, via selective epitaxial growth of one or more semiconductor materials, such as Si, Ge, SiGeC, GaAs, GaN, AlN, InN, InGaP, or another suitable semiconductor material, where the respective type of semiconductor material grown may differ between any of the launcher layer 118, the intrinsic base layer 120, and the emitter cap layer 122. For example, the launcher layer 118 and the emitter cap layer 122 may each be formed via selective epitaxial growth of silicon and the intrinsic base region 120 may be formed via selective epitaxial growth of SiGe. Each of the launcher layer 118, the intrinsic base layer 120, and the emitter cap layer 122 may be formed in the opening 502, in one or more embodiments. The intrinsic base layer 120 and the emitter cap layer 122 may each contact a side surface of the spacer 702.

For embodiments in which the transistor 101 is a npn transistor, the intrinsic base region 120 may be doped with p-type material, such as C, B, O, In, or another suitable p-type dopant, and the launcher layer 118 may be undoped or doped with n-type material, such as P, As, Sb, Li, or another suitable n-type dopant. For embodiments in which the transistor 101 is a pnp transistor, the intrinsic base region 120 may be doped with n-type material, such as P, As, Sb, Li, or another suitable n-type dopant, and the launcher layer 118 may be undoped or doped with p-type material, such as C, B, O, In, or another suitable p-type dopant. Emitter cap layer 122 may be undoped or doped with a similar type as the intrinsic base 120. The dopant concentration of the intrinsic base region 120 may be in a range of around 5e17 $cm^{-3}$ to 1e21 $cm^{-3}$, although higher or lower dopant concentrations may be used. The launcher layer 118 may include a low-doped (e.g., between around 1e16 $cm^{-3}$ and about 1e18 $cm^{-3}$, although other higher or lower dopant concentrations may be used) or undoped semiconductor material.

Figure 10:
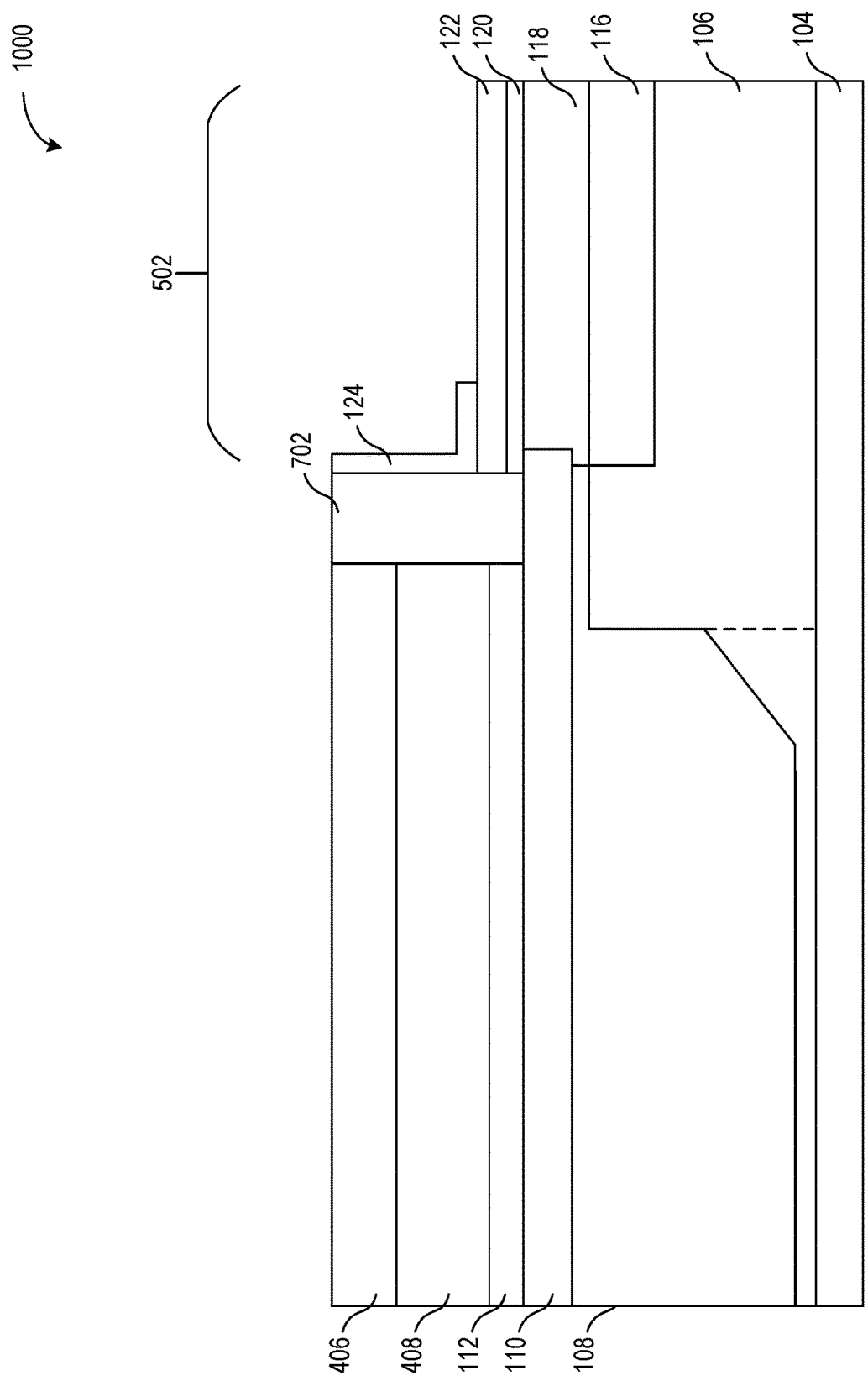

Referring next to step 218 of FIG. 2 and to FIG. 10, during a stage of fabrication 1000, the inside spacer 124 may be formed over a portion of the emitter cap layer 122 and in contact with a side surface of the spacer 702. In one or more embodiments, the inside spacer 124 may be formed on one or more surfaces of a first portion of the emitter cap layer 122, and not on surfaces of a second portion of the emitter cap layer 122.

In one or more embodiments, the inside spacer 124 is formed via isotropic deposition of one or more dielectric materials, such as $SiO_2$, TEOS, SiN, SiON, $Al_2O_3$, AlN, or other suitable dielectric materials and subsequent selective anisotropic etching of the one or more dielectric materials. Herein, an "anisotropic etch process" refers to an etch process that is directionally dependent (e.g., the etch rate for the processes in a given direction is higher than the respective etch rates for the process in one or more other directions). Herein, for comparison, [0074] an "isotropic etch process" refers to an etch process that, for a given material, has an etch rate that is constant or substantially constant in all directions (e.g., i.e., the etch rate for the process is not directionally dependent).

In one or more embodiments, the inside spacer 124 is formed via selective isotropic deposition of a first oxide layer, a nitride layer, and a second oxide layer, sequentially, such that the nitride layer is disposed between the first oxide layer and the second oxide layer of the inside spacer 124. That is, in such embodiments, the inside spacer 124 may include an ONO stack.

Figure 11:
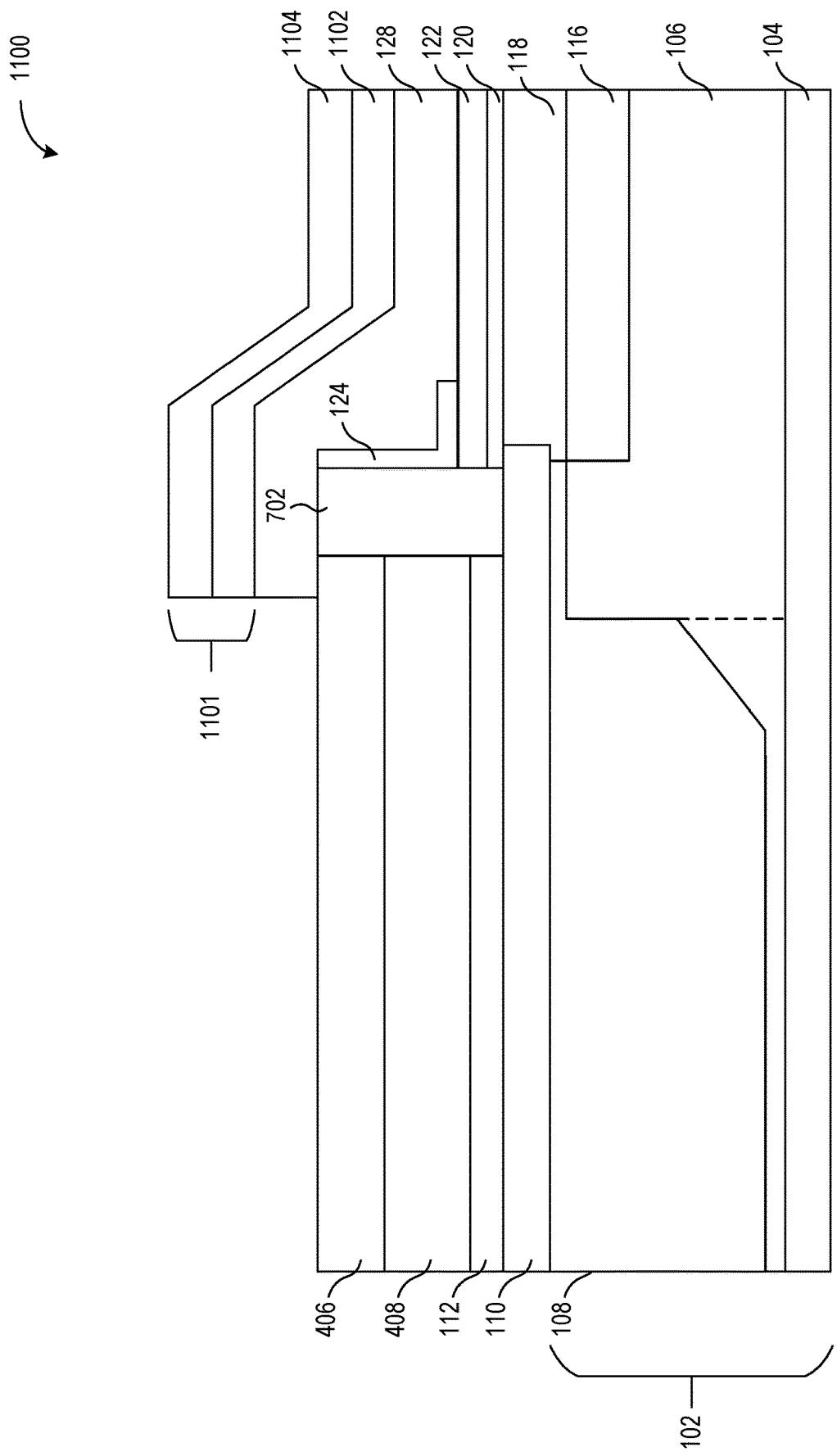

Referring next to step 220 of FIG. 2 and to FIG. 11, during a stage of fabrication 1100, the emitter layer 128 and a second dielectric stack 1101 may be formed at least partially in the opening 502 (i.e., at least partially in the emitter window). For example, the emitter layer 128 may be formed over the base substrate 102 via non-selective epitaxial growth of semiconductor material (e.g., Si, Ge, SiGe, GaAs, GaN, AlN, InN, InGaP, and/or other suitable semiconductor materials), then a nitride layer 1102 of the second dielectric stack 1101 may be deposited over (e.g., directly on) the emitter layer 128, then an oxide layer 1102 of the second dielectric stack 1101 may be deposited over (e.g., directly on) the nitride layer 1102, and then portions of each of the emitter layer 128, the oxide layer 1104, and the nitride layer 1102 may be removed via one or more etch processes.

In one or more embodiments, removal of the portions of emitter layer 128, the oxide layer 1104, and the nitride layer 1102 may be performed in conjunction with one or more photolithographic processes in which portions of the emitter layer 128, the oxide layer 1104, and the nitride layer 1102 to be preserved during the etch process(es) are protected (e.g., covered) by patterned photoresist material during the etch process(s), where the photoresist material is subsequently removed. Deposition of the nitride layer 1102 and the oxide layer 1104 may be performed using one or more deposition processes, such as sputtering, plasma deposition, chemical vapor deposition, evaporation or other suitable deposition processes. In one or more embodiments, the emitter layer 128 may include polycrystalline and/or amorphous Si or SiGe. In one or more embodiments, the emitter layer 128 may include a first portion formed from polycrystalline semiconductor material and a second portion formed from amorphous semiconductor material. In one or more other embodiments, the emitter layer 128 may include a first portion formed from polycrystalline or amorphous semiconductor material and a second portion that is formed from monocrystalline semiconductor material, where the second portion is disposed directly over the emitter cap layer 122.

Figure 12:
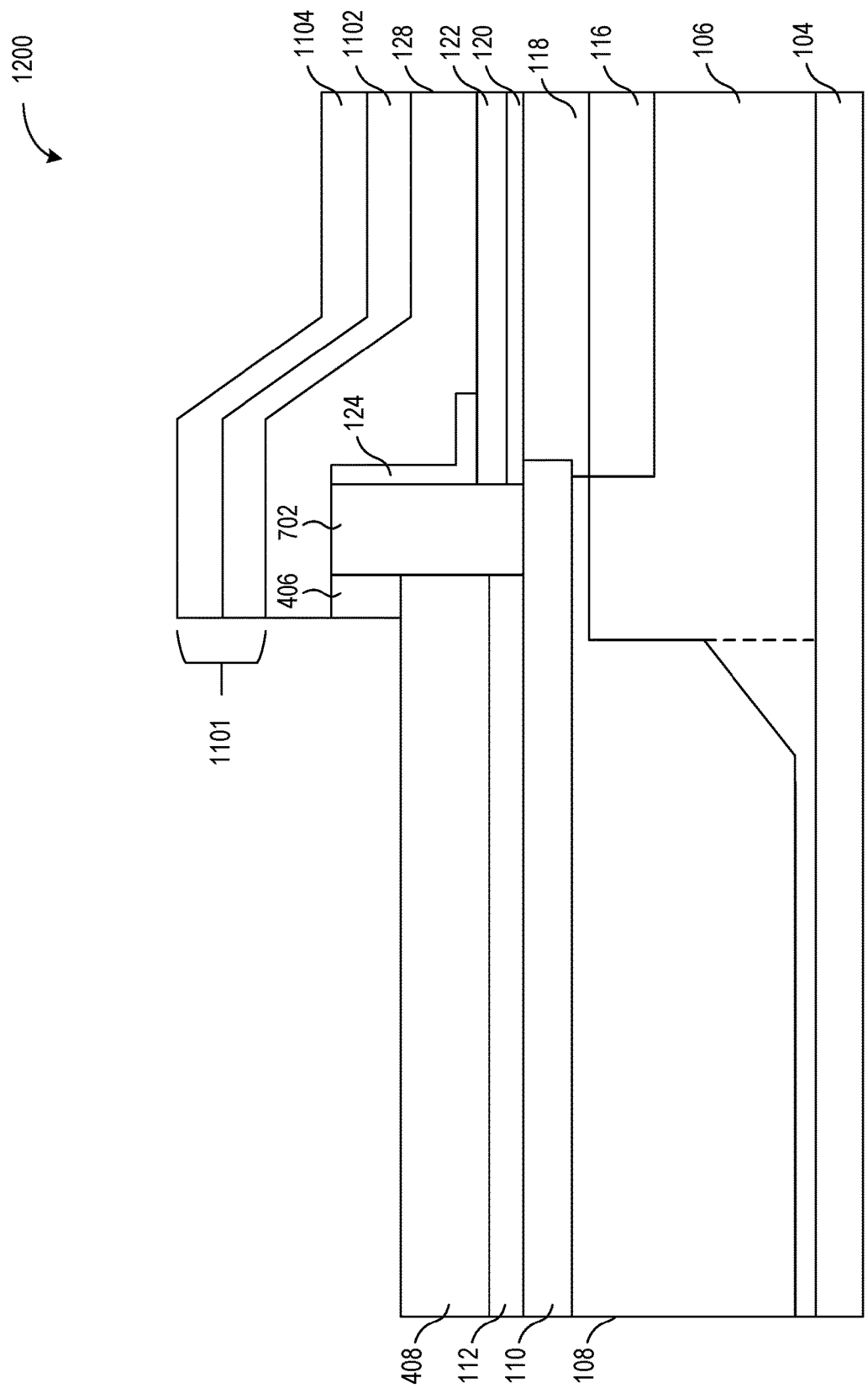

Referring next to step 222 of FIG. 2 and to FIG. 12, during a stage of fabrication 1200, a first portion of the second nitride layer 406 of the first dielectric stack may be removed via an anisotropic etch process (e.g., RIE or another suitable anisotropic etch process). After completion of the etch process, a second portion of the second nitride layer 406 may remain, which may be disposed directly under the emitter layer 128. For example, the second portion of the second nitride layer 406 that remains after the etch process may contact an underside of the emitter layer 128, a side surface of the spacer 702, and a top surface of the second oxide layer 408. In later steps, the second portion of the second nitride layer 406 may form a portion of the outside spacer 130.

Figure 13:
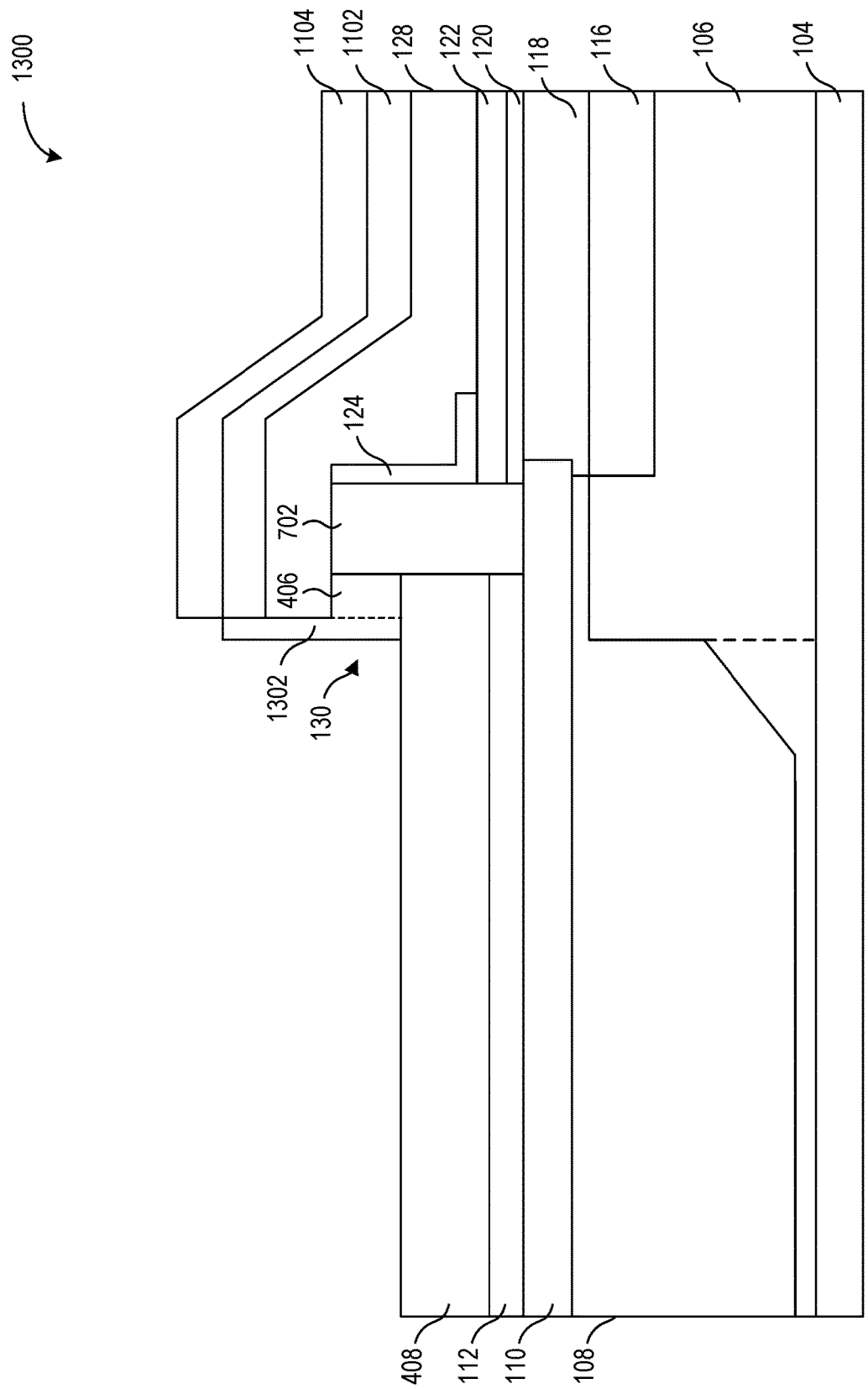

Referring next to step 224 of FIG. 2 and to FIG. 13, during a stage of fabrication 1300, a nitride layer 1302 is formed via deposition of dielectric material (e.g., SiN, AlN, or another suitable nitride material). In one or more other embodiments, the nitride layer 1302 may be formed from a material other than nitride, where such material has respectively different etch rates with respect to two or more etch processes compared to the oxide layer 1104 and the second oxide layer 408. For example, the nitride layer 1302 may formed by depositing dielectric material via sputtering, plasma deposition, chemical vapor deposition, evaporation or another suitable deposition process, then selectively etching (e.g., in conjunction with a photolithographic process) to remove undesired portions of the dielectric material, such that the nitride layer 1302 remains. The nitride layer 1302 may be disposed in contact with a top surface of the second oxide layer 408 and side surfaces of the nitride layer 1102, the emitter layer 128, and the second portion of the second nitride layer 406. In later steps, the nitride layer 1302 may form a portion of the outside spacer 130.

Figure 14:
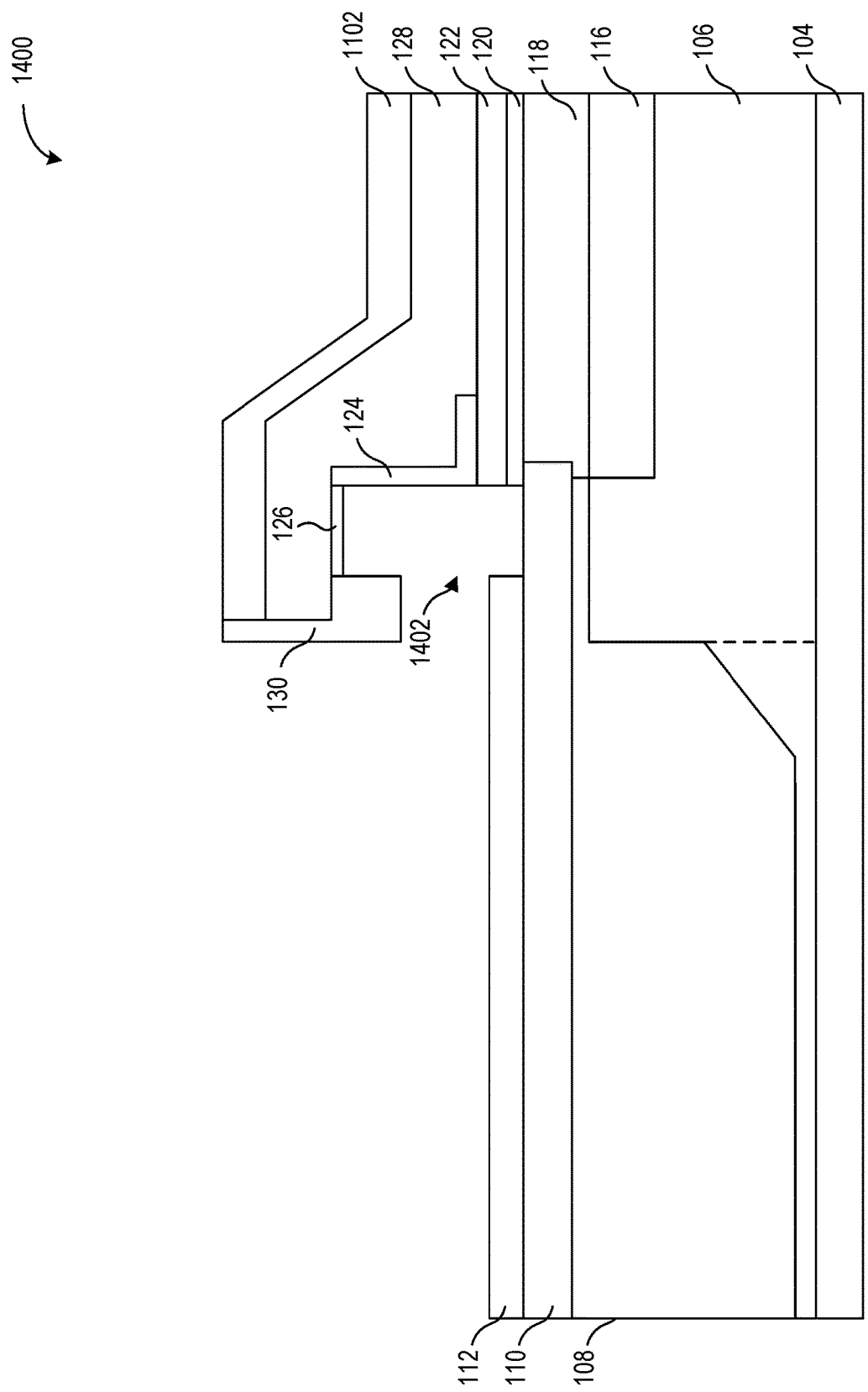

Referring next to step 226 of FIG. 2 and to FIG. 14, during a stage of fabrication 1400, the spacer 702, the second oxide layer 408, the oxide layer 1104 may be removed via an isotropic etch process (e.g., a wet chemical etch process such as a buffered oxide etch (BOE) as a non-limiting example). A portion of the spacer 702, corresponding to the dielectric material 126, may remain after completion of the etch process, where the dielectric material 126 may cover (e.g., protect) a portion of the underside (i.e., "bottom side") of the emitter layer 128. For example, the distance by which the outside spacer 130 extends out from the underside of the emitter layer 128 (corresponding to the initial height of the second nitride layer 406) may be selected such that the dielectric material 126 is at least partially protected from etching during the etch process. The etch process may form an opening 1402 defined by surfaces of the passivation layer 110, the extrinsic base layer 112, the intrinsic base layer 120, the emitter cap layer 122, the inside spacer 124, the dielectric material 126, and the outside spacer 130. In one or more other embodiments, the dielectric material 126 may be partially or completely etched away such that a portion of the underside of the emitter layer 128 is exposed, which may have little or no negative impact on the performance of the transistor 101 compared to embodiments in which the dielectric material 126 completely covers the portion the underside of the emitter layer 128 (e.g., compared to embodiments in which the dielectric material 126 prevents semiconductor material growth on the portion of the underside of the emitter layer 128).

Figure 15:
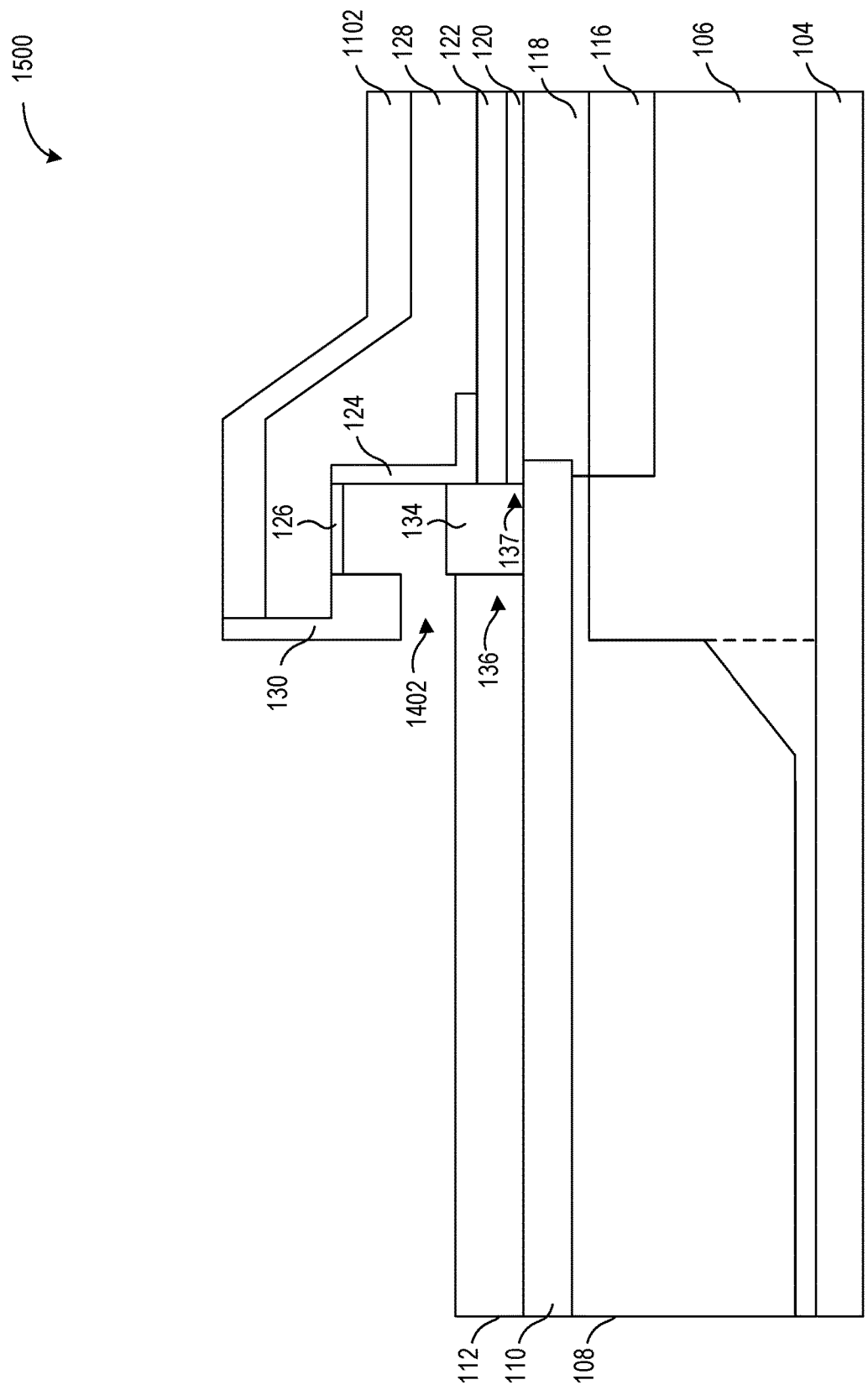

Referring next to step 228 of FIG. 2 and to FIG. 15, during a stage of fabrication 1500, a selective epitaxial growth process is performed, which forms additional semiconductor material on the extrinsic base layer 112 (e.g., thereby increasing the thickness of the extrinsic base layer 112) and which grows semiconductor material on side surface 136 of the extrinsic base layer 112 and the side surface 137 of the intrinsic base layer 120 to form the lateral base link region 134. In one or more embodiments, the lateral base link region 134 may include a first portion that is formed from the same semiconductor material as that of the intrinsic base layer 120 (e.g., monocrystalline semiconductor material such as monocrystalline SiGe) and a second portion that is formed from the same semiconductor material as the extrinsic base layer 112 (e.g., polycrystalline or amorphous semiconductor material such as polycrystalline or amorphous silicon or SiGe). The first portion of the lateral base link region 134 may correspond to the semiconductor material that is grown on the side surface 137 of the intrinsic base layer 120 by the selective epitaxial growth process, and the second portion of the lateral base link region 134 may correspond to the semiconductor material that is grown on the side surface 136 of the extrinsic base layer 112 by the selective epitaxial growth process. The lateral base link region 134 may directly contact surfaces of the intrinsic base layer 120, the extrinsic base layer 112, the passivation layer 110, the emitter cap layer 122, and the inside spacer 124. The lateral base link region 134 may be disposed entirely over the passivation layer 110 and the isolation region 108, such that portions of the passivation layer 110 and the isolation region 108 are interposed between the lateral base link region 134 and the collector region 106.

By forming the lateral base link region 134 directly over the dielectric material(s) of the passivation layer 110 and the isolation region 108, the collector-base capacitance of the transistor 101 may be advantageously reduced (e.g., compared to if the base link region were formed directly on the collector region). By forming at least a portion of the base link region from monocrystalline silicon (e.g., the same material as the intrinsic base layer 120) in one or more embodiments, base resistance of the transistor 101 may be advantageously decreased. By forming the lateral base link region 134 independently from formation of the intrinsic base layer 120, each of the lateral base link region 134 and the intrinsic base layer 120 may be independently optimized. For example, the lateral base link region 134 may be more heavily doped than the intrinsic base layer 120 (e.g., with the same dopant type; with a doping concentration of around 1e20 $cm^{-3}$ to around 1e21 $cm^{-3}$ in one or more embodiments), which may advantageously reduce base resistance of the transistor 101. In one or more embodiments, other materials (e.g., Ge) may be incorporated into the lateral base link region (e.g., independently from the intrinsic base layer 120), which may improve dopant activation and lower resistance.

Figure 16:
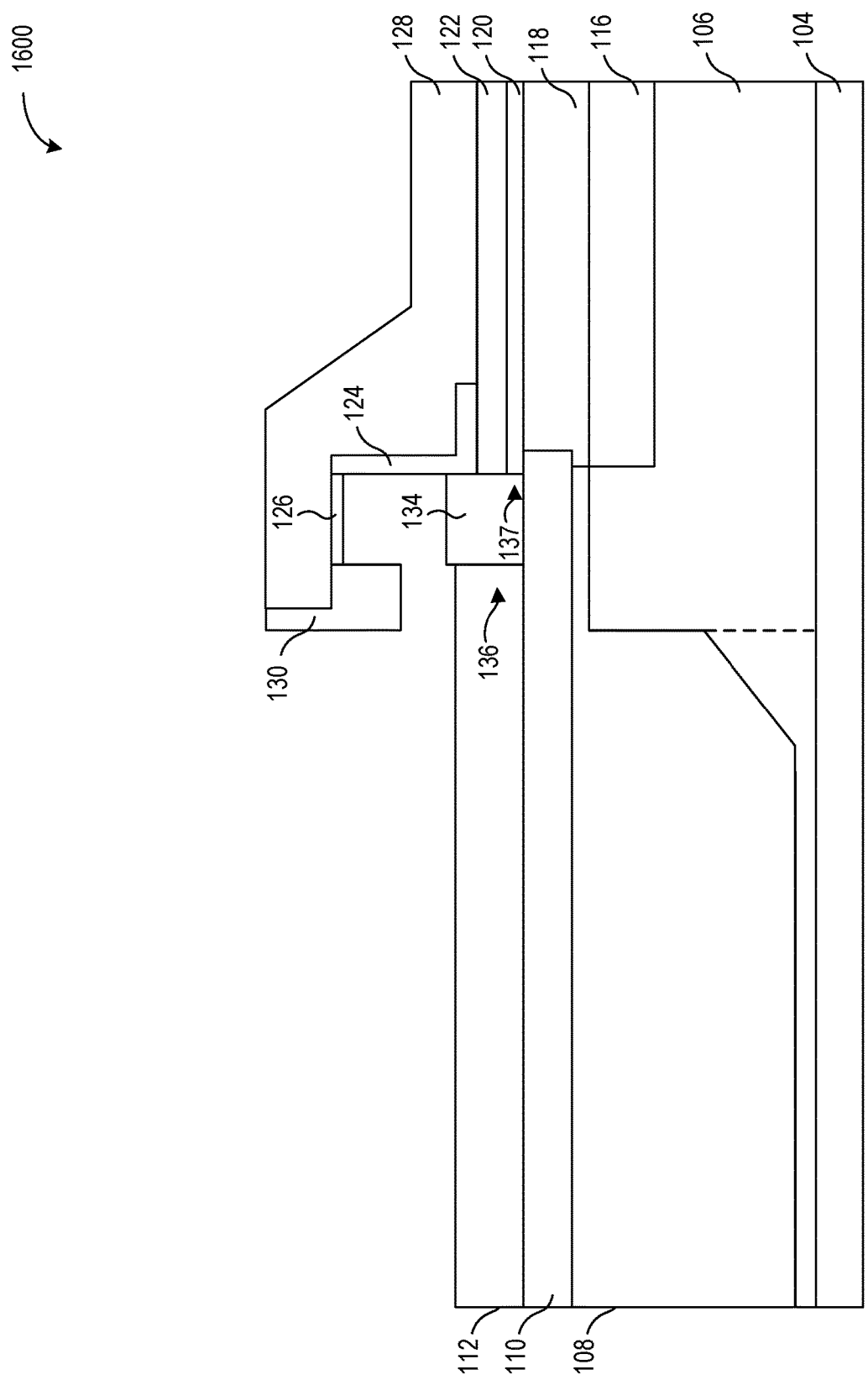

Referring next to step 230 of FIG. 2 and to FIG. 16, during a stage of fabrication 1600, the nitride layer 1102 is removed via an anisotropic etch process (e.g., RIE or another suitable anisotropic etch process). Removal of the nitride layer 1102 may expose the top surface of the emitter layer 128 (e.g., for subsequent silicidation/contact formation).

Figure 17:
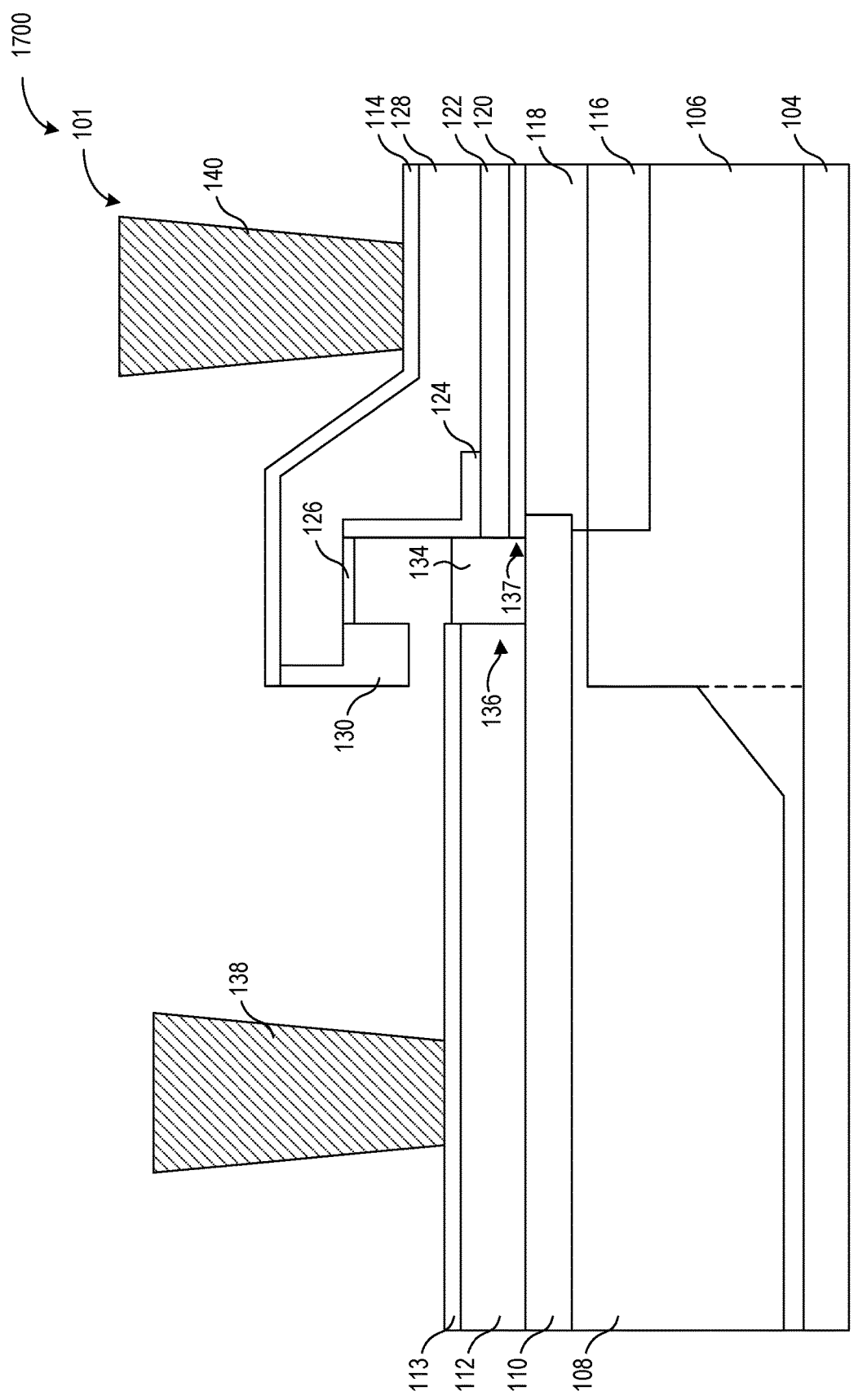

Referring next to step 232 of FIG. 2 and to FIG. 17, during a stage of fabrication 1700, the contact layers 113 and 114, the base electrode 138, and the emitter electrode 140 are formed. The contact layer 113 may be formed on the extrinsic base region 112. The contact layer 114 may be formed on the emitter region 128. The base electrode 138 may be formed over the extrinsic base region 112 directly on the contact layer 113. The emitter electrode 140 may be formed over the emitter region 128 directly on the contact layer 114. In one or more embodiments, the contact layers 113 and 114 are formed via a silicidation process. In one or more embodiments, the base electrode 138 and emitter electrode 140 are formed via one more metal deposition processes (e.g., sputtering, evaporation, plating, or another suitable metal deposition process) where the deposited metal is then patterned using suitable photolithography and etch processes. In one or more embodiments, the contact layers 113 and 114 include one or more of TiW, TiWN, WSi, CoSi, PtSi, NiPtSi, or one or more other suitable material(s). In one or more embodiments, the base electrode 138 and the emitter electrode 140 may include one or more of copper, aluminum, tungsten, or another suitable conductive material.

While, in the examples of FIGS. 2-17, the layers 110, 130, 402, 406, 1102, and 1302 have been described as including nitride material in one or more embodiments and the layers 126, 404, 408, 602, and 1104 have been described as including oxide material in one or more embodiments, such arrangements are intended to be illustrative and not limiting. For example, in one or more other embodiments, the layers 110, 130, 402, 406, 1102, and 1302 may be formed from a first dielectric material or a first group of dielectric materials and the layers 126, 404, 408, 602, and 1104 may be formed from a second dielectric material or a second group of dielectric materials, where the first dielectric material or first group of dielectric materials may be separately etchable from the second dielectric material or the second group of dielectric materials (and vice versa) with respect to two or more etch processes (e.g., RIE processes, wet chemical etch processes, or other suitable etch processes). That is, with respect to a first etch process, the first dielectric material or first group of dielectric materials may have comparatively higher respective etch rates and the second dielectric material or second group of dielectric materials may have comparatively lower respective etch rates, such that the first etch process may be used to remove exposed portions of the first dielectric material or first group of dielectric materials while removing little or none of the exposed portions of the second dielectric material or second group of dielectric materials. And, with respect to a second etch process (i.e., that is different from the first etch process), the second dielectric material or second group of dielectric materials may have comparatively higher respective etch rates and the first dielectric material or first group of dielectric materials may have comparatively lower respective etch rates, such that the second etch process may be used to remove exposed portions of the second dielectric material or second group of dielectric materials while removing little or none of the exposed portions of the first dielectric material or first group of dielectric materials. The first dielectric material, first group of dielectric materials, second dielectric material, and/or second group of dielectric material may include any suitable combination of dielectric materials (e.g., in view of these comparative etch rate requirements), which may include any of $SiO_2$, TEOS, SiN, SiON, $Al_2O_3$, or AlN, or spun glass as non-limiting examples.

It should be understood that, in addition to those processing steps described herein, other processing steps may be performed to complete any of the transistor device 101 of FIG. 1 including, but not limited to, the deposition and patterning of additional dielectric layers and/or metal layers and/or the formation of molding or underfill material.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter.

Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method comprising:
    providing a substrate that includes an isolation region that includes dielectric material and a collector region that includes semiconductor material, and a passivation layer disposed on the substrate;
    forming an extrinsic base layer on the passivation layer;
    forming an intrinsic base layer over the collector region; and forming a lateral base link region between the extrinsic base layer and the intrinsic base layer, wherein the lateral base link region is disposed on the passivation layer and directly contacts respective side surfaces of the extrinsic base layer and the intrinsic base layer, wherein the lateral base link region is separated from the collector region by at least the passivation layer, and wherein the lateral base link region is formed after forming the intrinsic base layer.

2. The method of claim 1, wherein the extrinsic base layer comprises polycrystalline semiconductor material, the intrinsic base layer comprises monocrystalline semiconductor material, and the lateral base link region comprises a first portion that includes monocrystalline semiconductor material and a second portion that includes polycrystalline semiconductor material.

3. The method of claim 2, wherein the first portion of the lateral base link region directly contacts the intrinsic base layer and the second portion of the lateral base link region directly contacts the extrinsic base layer.

4. The method of claim 2, wherein the polycrystalline semiconductor material of each of the extrinsic base layer and the first portion of the lateral base link region is selected from the group consisting of polycrystalline silicon and polycrystalline silicon germanium, and wherein the monocrystalline semiconductor material of each of the intrinsic base layer and the second portion of the lateral base link region is selected from the group consisting of monocrystalline silicon and monocrystalline silicon germanium.

5. The method of claim 2, further comprising:
forming a first dielectric stack on the extrinsic base layer;
forming an emitter window by etching a first opening in the first dielectric stack and the extrinsic base layer, wherein the first opening exposes a portion of the isolation region;
forming an oxide layer over the first dielectric stack; and
removing portions of the oxide layer via a first anisotropic etch process to form a spacer corresponding to a remaining portion of the oxide layer, wherein the spacer is disposed in contact with a side surface of the first dielectric stack and a top surface of the passivation layer.

6. The method of claim 5, further comprising:
removing the portion of the isolation region exposed by the first opening to expose a surface of the collector region;
forming a launcher layer on the exposed surface of the collector region via selective epitaxial growth, wherein forming the intrinsic base layer over the collector region comprises forming the intrinsic base layer on the launcher layer via selective epitaxial growth; and
forming an emitter cap layer on the intrinsic base layer, wherein the emitter cap layer and the launcher layer each comprise silicon.

7. The method of claim 6, further comprising:
forming an emitter layer on the emitter cap layer; and
forming a second dielectric stack on the emitter layer, wherein the emitter layer comprises polycrystalline semiconductor material, each of the emitter layer and the second dielectric stack are disposed at least partially in the emitter window, and a portion of the emitter layer is disposed on the spacer.

8. The method of claim 7, further comprising:
forming an outside spacer in contact with at least a side surface and a bottom surface of the emitter layer, wherein a portion of the outside spacer comprises a portion of a first layer of the first dielectric stack.

9. The method of claim 8, further comprising:
concurrently removing the spacer, a second layer of the first dielectric stack, and a first layer of the second dielectric stack, wherein removal of the spacer forms a second opening that is disposed between the passivation layer and the emitter layer.

10. The method of claim 9, wherein forming the lateral base link region comprises:
forming the lateral base link region in the second opening via selective epitaxial growth of one or more semiconductor materials, respectively, on each of a side surface of the intrinsic base layer and a side surface of the extrinsic base layer.

11. A transistor device comprising:
a substrate comprising a collector region that includes semiconductor material and an isolation region that includes first dielectric material;
a dielectric layer that includes second dielectric material, wherein the dielectric layer is formed over the substrate;
a first semiconductor layer disposed on the dielectric layer overlapping the isolation region;
a second semiconductor layer disposed over the collector region, wherein at least a portion of the second semiconductor layer is disposed on the dielectric layer;
a third semiconductor layer disposed on the dielectric layer between the first semiconductor layer and the second semiconductor layer, wherein the third semiconductor layer is separated from the collector region by at least the dielectric layer; and
a fourth semiconductor layer disposed over the second semiconductor layer and the third semiconductor layer.

12. The transistor device of claim 11, the first semiconductor layer corresponds to an extrinsic base region, the second semiconductor layer corresponds to an intrinsic base region, the third semiconductor layer corresponds to a lateral base link region, and the fourth semiconductor layer corresponds to an emitter region.

13. The transistor device of claim 11, wherein:
the first semiconductor layer comprises semiconductor material selected from the group consisting of polycrystalline silicon and polycrystalline silicon germanium;
the second semiconductor layer comprises semiconductor material selected from the group consisting of monocrystalline silicon and monocrystalline silicon germanium;
the third semiconductor layer comprises a first portion that includes semiconductor material selected from the group consisting of monocrystalline silicon and monocrystalline silicon germanium; and
the third semiconductor layer comprises a second portion that includes semiconductor material selected from the group consisting of polycrystalline silicon and polycrystalline silicon germanium.

14. The transistor device of claim 11, further comprising:
a fifth semiconductor layer disposed between the collector region and the second semiconductor layer; and
a sixth semiconductor layer disposed between the second semiconductor layer and the fourth semiconductor layer.

15. The transistor device of claim 14, wherein the fifth semiconductor layer corresponds to a launcher layer formed from silicon, and the sixth semiconductor layer corresponds to an emitter cap layer formed from silicon.

16. The transistor device of claim 14, further comprising:
an inside spacer disposed between the fourth semiconductor layer and the sixth semiconductor layer, the inside spacer comprising one or more layers of one or more dielectric materials; and
an outside spacer disposed in contact with a side surface of the fourth semiconductor layer and a bottom surface of the fourth semiconductor layer.

17. The transistor device of claim 16, further comprising:
an oxide layer disposed on the bottom surface of the fourth semiconductor layer between the inside spacer and the outside spacer.

18. The transistor device of claim 17, wherein the oxide layer is disposed overlapping the third semiconductor layer and is separate from the third semiconductor layer.

19. The transistor device of claim 11, wherein the third semiconductor layer has a first dopant concentration that is greater than a second dopant concentration of the second semiconductor layer.

* * * * *